US012677680B2

(12) United States Patent
Satake et al.

(10) Patent No.: US 12,677,680 B2
(45) Date of Patent: Jul. 7, 2026

(54) COMPOSITE COMPONENT AND METHOD FOR MANUFACTURING THE SAME

(71) Applicant: Murata Manufacturing Co., Ltd., Kyoto-fu (JP)

(72) Inventors: Yoshiaki Satake, Nagaokakyo (JP); Tatsuya Funaki, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 553 days.

(21) Appl. No.: 18/321,417

(22) Filed: May 22, 2023

(65) Prior Publication Data

US 2023/0352388 A1 Nov. 2, 2023

Related U.S. Application Data

(63) Continuation of application No. PCT/JP2021/032500, filed on Sep. 3, 2021.

(30) Foreign Application Priority Data

Dec. 24, 2020 (JP) ................................. 2020-215251

(51) Int. Cl.
*H10W 70/63* (2026.01)
*H10W 20/00* (2026.01)
(Continued)

(52) U.S. Cl.
CPC ....... *H10W 70/635* (2026.01); *H10W 20/043* (2026.01); *H10W 70/698* (2026.01); *H10W 76/17* (2026.01)

(58) Field of Classification Search
None
See application file for complete search history.

(56) References Cited

U.S. PATENT DOCUMENTS

2011/0080713 A1* 4/2011 Sunohara ............ H10W 70/635
361/760
2012/0161333 A1* 6/2012 Thuaire ............... H10W 20/023
257/E23.145
2017/0290161 A1* 10/2017 Shimura .................. H01G 4/40

FOREIGN PATENT DOCUMENTS

JP 2003-086626 A 3/2003
JP 2005-12180 A 1/2005
(Continued)

OTHER PUBLICATIONS

International Search Report issued in PCT/JP2021/032500; mailed Nov. 2, 2021.

*Primary Examiner* — Zandra V Smith
*Assistant Examiner* — Daniel J Hibbert
(74) *Attorney, Agent, or Firm* — Studebaker Brackett PLLC

(57) ABSTRACT

A composite component includes an interposer structure and an electronic component. The interposer structure has a Si base layer having a first main surface and a second main surface opposite to each other, a redistribution layer formed on the first main surface, through-Si vias electrically connected to the redistribution layer and penetrating the Si base layer, an interposer electrode facing the second main surface, an adhesive layer and an insulating layer. The electronic component has component electrodes respectively connected to the through-Si vias. The electronic component is provided between the interposer electrode and the Si base layer. The insulating layer is disposed between the component electrodes of the electronic component. In the electronic component, the component electrode and a surface on which the insulating layer is disposed are bonded to the second main surface of the Si base layer with the adhesive layer interposed therebetween.

17 Claims, 16 Drawing Sheets

(51)  Int. Cl.
     *H10W 70/698*     (2026.01)
     *H10W 76/17*      (2026.01)

(56)               References Cited

FOREIGN PATENT DOCUMENTS

| JP | 2011-82293 A | 4/2011 |
|----|--------------|--------|
| JP | 2012-178547 A | 9/2012 |
| JP | 2016-72332 A | 5/2016 |
| JP | 2017-17238 A | 1/2017 |
| JP | 2017-188545 A | 10/2017 |
| JP | 2020-92147 A | 6/2020 |

* cited by examiner

FIG. 4C
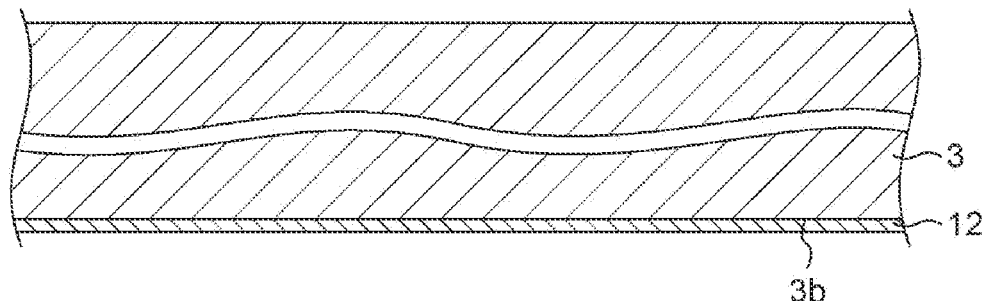
FIG. 4D
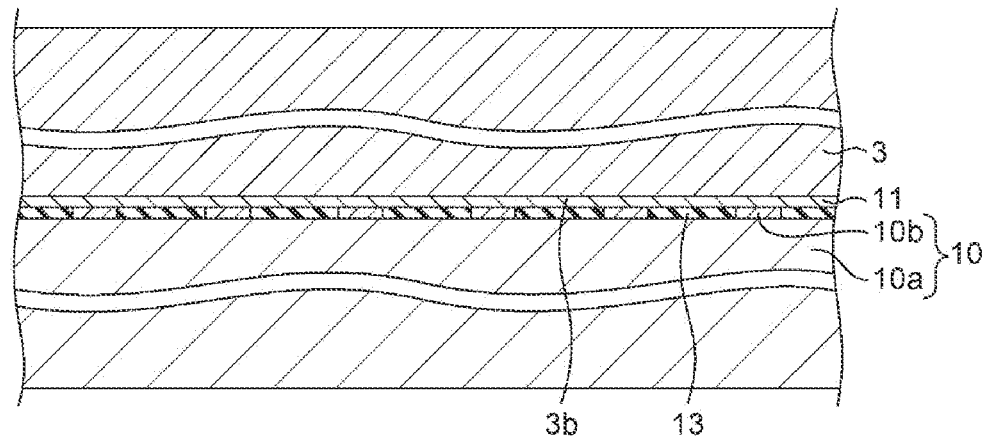
FIG. 4E

COMPOSITE COMPONENT AND METHOD FOR MANUFACTURING THE SAME

CROSS-REFERENCE TO RELATED APPLICATIONS

This application claims benefit of priority to International Patent Application No. PCT/JP2021/032500, filed Sep. 3, 2021, and to Japanese Patent Application No. 2020-215251, filed Dec. 24, 2020, the entire contents of each are incorporated herein by reference.

BACKGROUND

Technical Field

The present disclosure relates to a composite component and a method for manufacturing the same.

Background Art

In the past, as a composite component in which an electronic component is mounted on a circuit board, for example, there is a semiconductor device described in FIG. 1 of Japanese Unexamined Patent Application Publication No. 2017-17238. The semiconductor device has an insulating material layer on one side thereof. The insulating material layer is provided with an outer electrode, and a semiconductor element is mounted on a back side of a surface of the insulating material layer on which the outer electrode is mounted with an adhesive interposed therebetween, with an element circuit surface and an electrode disposed on the element circuit surface facing upward. The semiconductor element and a periphery thereof are sealed by a second insulating material layer. A metal thin film wiring layer made of copper or a copper alloy is provided so as to accompany the first insulating material layer and the second insulating material layer. Between any wiring layers of the metal thin film wiring layer and between the metal thin film wiring layer and the semiconductor element and the electrode are each electrically connected by a metal via.

SUMMARY

However, it has been found that the composite component described above has the following problems. When a hole is formed in a resin insulating layer by a laser, a time at which a laser beam reaches a component electrode is set. Although the laser irradiation is stopped at the specific set time, part of an electrode surface is roughened due to a variation in thickness of the component electrode. As a result, connection reliability between the electrode and plating is decreased. Furthermore, the resin insulating layer is formed on a surface of a substrate (electronic component) by a spin coating method or the like, but there is a possibility that a void (air gap) is generated in the resin insulating layer.

Thus, the present disclosure provides a composite component with which a reduction in electrical connectivity is suppressed and reliability of an electronic device in which the composite component is used is improved.

The present inventors have conducted intensive studies in view of the above-described problems and have found out that when a void formed in a resin insulating layer changes in volume or moves during an adhesive solidification step, a position gap of a component occurs. The present inventors have obtained knowledge that this causes a reduction in electrical connectivity between electronic components.

Based on such technical knowledge, the present inventors have attained the present disclosure in which an insulating layer is disposed between component electrodes of an electronic component to suppress formation of a void around the above connection portion and to improve connectivity with a metal via. That is, the present disclosure includes the following embodiments.

A composite component as an aspect of the present disclosure includes an interposer structure having a Si base layer having a first main surface and a second main surface opposite to each other, a redistribution layer formed on the first main surface, through-Si vias electrically connected to the redistribution layer and penetrating inside the Si base layer, an interposer electrode facing the second main surface, an adhesive layer, and an insulating layer. The composite component further includes an electronic component having component electrodes respectively connected to the through-Si vias. The electronic component is provided between the interposer electrode and the Si base layer. The insulating layer is disposed between component electrodes of the electronic component, each of which being respectively connected to the through-Si vias, and in the electronic component, the component electrode and a surface on which the insulating layer is disposed are bonded to the second main surface of the Si base layer with the adhesive layer interposed therebetween.

According to the above-described embodiment, since the insulating layer is disposed in a recess between the component electrodes, unevenness between the component electrodes is flattened. Accordingly, in forming the adhesive layer in manufacturing the composite component, formation of a void due to insufficient intrusion of the adhesive into the recess is suppressed. As a result, a position gap of the electronic component due to a change in volume or movement of a void generated during a solidification step of the adhesive and poor connection between the through-Si via and the component electrode due to a void entering underneath the through-Si via are suppressed. Thus, with the composite component according to the present embodiment, a decrease in reliability of an electronic device in which the composite component is used can be inhibited. Further, the electronic component can be electrically connected at the shortest distance near the Si base layer, thus low ESR of the composite component can be achieved.

In addition, in an embodiment of the composite component, a level difference at an interface between the component electrode and the insulating layer in a cross section parallel to a stacking direction of the interposer structure and the electronic component is equal to or less than 1.0 µm.

According to the above-described embodiment, the level difference at the interface between the component electrode and the insulating layer is equal to or less than 1.0 µm. In this manner, flatness of a surface formed by the component electrode and the insulating layer is improved, thus there is no substantial need for the adhesive layer to compensate for the level difference and a thickness of the adhesive layer can be decreased. Thus, a length of a via wiring line can be decreased, and DC resistance Rdc and thermal resistance are reduced. Thus, with the composite component according to the present embodiment, characteristics of an electronic component module can be improved. In addition, since the thickness of the adhesive layer can be decreased, the composite component according to the present embodiment can be reduced in size and thickness.

In addition, in an embodiment of the composite component, surface roughness Rz of the component electrode and the insulating layer is equal to or less than 1.0 µm.

According to the above-described embodiment, the surface roughness Rz of the component electrode and the insulating layer is equal to or less than 1.0 μm. Thus, the flatness of the surface formed by the component electrode and the insulating layer is improved. Since the thickness of the adhesive layer can be decreased, Rdc and the thermal resistance are reduced. Accordingly, with the composite component according to the present embodiment, the characteristics of the electronic component module can be improved. In addition, the composite component according to the present embodiment can be reduced in size and thickness.

In addition, in an embodiment of the composite component, the thickness of the adhesive layer is equal to or less than 10 μm.

According to the above-described embodiment, by setting the thickness of the adhesive layer in the above-described range, a thickness of the composite component is decreased. Thus, the composite component can be reduced in size and thickness. In addition, Rdc (the DC resistance) and thermal resistance are reduced, and the characteristics of the electronic component module are improved.

In addition, in an embodiment of the composite component, among components constituting the redistribution layer and the insulating layer, common components occupy equal to or greater than 80% by weight.

According to the above-described embodiment, since most of the components constituting the redistribution layer and the insulating layer are common, coefficients of linear expansion among materials constituting the redistribution layer and the insulating layer are substantially the same. Accordingly, with the composite component according to the present embodiment, reliability of an entirety of the composite component at the time of heating due to a difference between the coefficients of linear expansion is improved.

In addition, in an embodiment of the composite component, the redistribution layer is formed of an inorganic material, and the insulating layer is formed of an organic material.

According to the above-described embodiment, since the redistribution layer is formed of an inorganic material, a thin film and fine wiring for the redistribution layer can be achieved, and the insulating layer is formed of an organic material, thus can be formed at low cost. Accordingly, in the above-described embodiment, total costs can be reduced.

In addition, in an embodiment of the composite component, the redistribution layer is formed of an organic material, and the insulating layer is formed of an inorganic material.

According to the above-described embodiment, the redistribution layer is formed of an organic material and can be formed at low cost, so that total costs can be reduced. In addition, the insulating layer is formed of an inorganic material, thus a thickness thereof can be decreased as compared with an organic material, during manufacturing, and further lower RDC and ESR can be achieved.

In addition, in an embodiment of the composite component, in a cross section parallel to a stacking direction of the interposer structure and the electronic component, crystal grains of the component electrode increase in size from a side where the component electrode is in contact with the through-Si via toward the side opposite thereto.

According to the above-described embodiment, the crystal grains of the component electrode are relatively small on the side where the component electrode is in contact with the through-Si via, thus a cross-sectional area occupied by a crystal grain boundary on the contact side is relatively large. Accordingly, with the composite component according to the present embodiment, the joining property of the component electrode with the through-Si via can be improved.

In addition, in an embodiment of a method for manufacturing a composite component, included are a filling step of filling a space between component electrodes of an electronic component with an insulating material, a flattening step of performing flattening treatment on a surface of a component electrode included in the component electrodes and the insulating material to form an insulating layer between the component electrodes, and an electronic component bonding step of forming an adhesive layer on a Si base layer and bonding the electronic component onto the Si base layer such that the component electrode and the insulating layer face the Si base layer with the adhesive layer interposed therebetween. The method further includes a through-hole forming step of forming a through-hole in the Si base layer and the adhesive layer by etching to expose the component electrode of the electronic component, and a through-Si via forming step of forming a through-Si via in the through-hole by electrolytic plating.

According to the above-described embodiment, the insulating layer is disposed in a recess between the component electrodes in the filling step and the flattening step, thus unevenness between the component electrodes is flattened. Accordingly, in the electronic component bonding step, formation of a void due to insufficient intrusion of the adhesive into the recess is suppressed. As a result, a component position gap due to a change in volume or movement of a void generated in a solidification step of the adhesive and poor connection between the through-Si via and the component electrode due to a void entering underneath the through-Si via are suppressed. Thus, with the method for manufacturing the composite component according to the present embodiment, a composite component for which a decrease in reliability can be inhibited can be provided.

In addition, in an embodiment of the method for manufacturing the composite component, further included are a Si support pasting step of pasting a Si support onto the electronic component bonded onto the Si base layer, and a Si base layer thinning step of thinning the Si base layer facing the Si support with the electronic component interposed therebetween.

According to the above-described embodiment, the Si base layer is supported by the Si support for thinning, thus the Si base layer can be thinned. Thus, with the manufacturing method according to the present embodiment, a composite component which is excellent in electronic component module characteristics and is reduced in thickness and size can be manufactured.

In addition, in an embodiment of the method for manufacturing the composite component, further included are an electronic component sealing step of forming an electronic component layer in which the electronic component bonded onto the Si base layer is sealed with resin and integrated, a Si support forming step of pasting a Si support onto the electronic component layer, and a Si base layer thinning step of thinning the Si base layer facing the Si support with the electronic component interposed therebetween.

According to the above-described embodiment, the Si base layer is supported by the Si support for thinning, thus the Si base layer can be thinned. Thus, with the manufacturing method according to the present embodiment, a composite component which is excellent in electronic component module characteristics and is reduced in thickness and size can be manufactured.

According to a composite component as an aspect of the present disclosure, it is possible to suppress a reduction in electrical connectivity and to improve reliability of an electronic device in which the composite component is used.

BRIEF DESCRIPTION OF THE DRAWINGS

FIG. 4C is an explanatory diagram for explaining the method for manufacturing the composite component;

FIG. 4D is an explanatory diagram for explaining the method for manufacturing the composite component;

FIG. 4E is an explanatory diagram for explaining the method for manufacturing the composite component;

DETAILED DESCRIPTION

Hereinafter, a composite component as an aspect of the present disclosure will be described in detail with reference to embodiments illustrated in the figures. Note that the figures are partially schematic and do not reflect actual dimensions or ratios in some cases. In addition, dimensions (more specifically, thicknesses, diameters and the like) of constituent elements in the composite component were measured based on an SEM image captured by a scanning electron microscope. The above-described dimension was obtained from an average of a plurality of measurements (the number of measurements $n \geq 5$).

First Embodiment

[Configuration]

Figure 1:
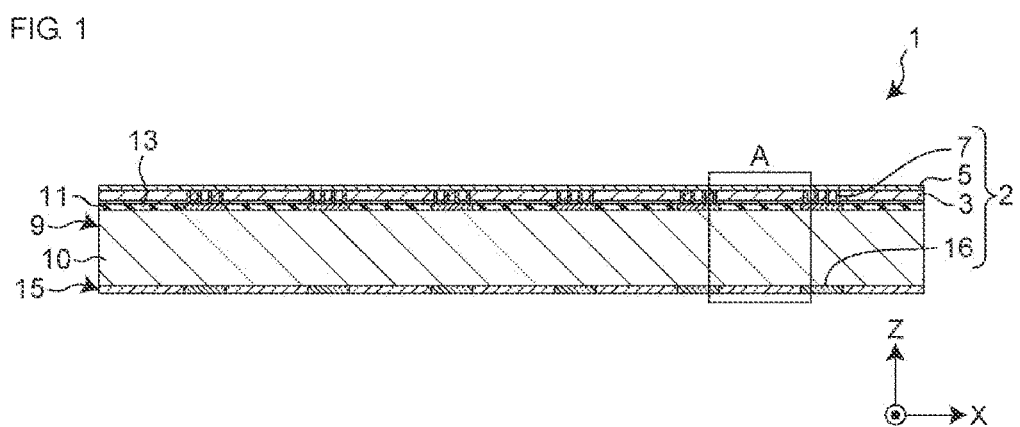
FIG. 1 is a sectional view illustrating a first embodiment of a composite component.
Figure 2:
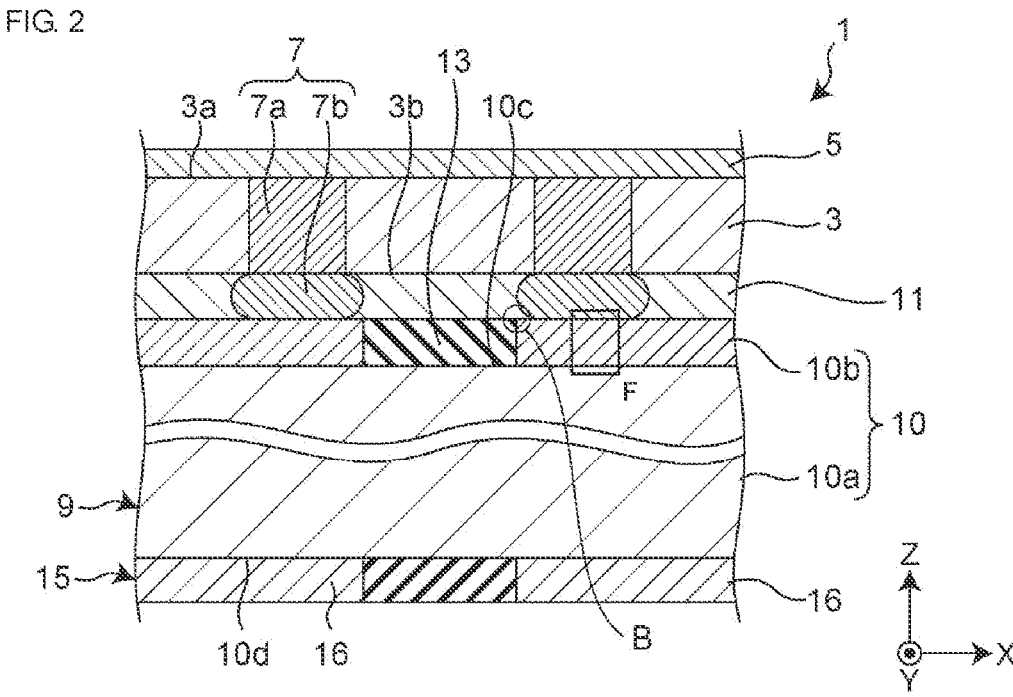
FIG. 2 is an enlarged view of a part A of FIG. 1.

FIG. 1 is a diagram schematically illustrating a cross section of a composite component 1 according to a first embodiment of the present disclosure. FIG. 2 is an enlarged view of a part A of FIG. 1.

As illustrated in FIG. 1 and FIG. 2, the composite component 1 includes an interposer structure 2 and an electronic component 10. In the figure, a direction parallel to a thickness of the composite component 1 is defined as a Z direction, a forward Z direction is defined as an upper side, and a reverse Z direction is defined as a lower side. In a plane orthogonal to the Z direction of the composite component 1, a direction parallel to a paper surface on which the figure is illustrated is defined as an X direction, and a direction orthogonal to the paper surface on which the figure is illustrated is defined as a Y direction.

In the composite component 1 according to the present embodiment, the interposer structure 2 has a Si base layer 3 having a first main surface 3a and a second main surface 3b opposite to each other, a redistribution layer 5 formed on the first main surface 3a, a through-Si via 7 electrically connected to the redistribution layer 5 and penetrating an inside of the Si base layer 3, an interposer electrode 16 facing the second main surface 3b, an adhesive layer 11, and an insulating layer 13. The electronic component 10 has a component electrode 10b connected to the through-Si via 7. The electronic component 10 is provided between the interposer electrode 16 and the Si base layer 3. The insulating layer 13 is disposed between the component electrodes 10b of the electronic component 10. In the electronic component 10, the component electrode 10b and a surface (third main surface 10c) on which the insulating layer 13 is disposed are bonded to the second main surface 3b of the Si base layer 3 with the adhesive layer 11 interposed therebetween.

As described above, in the composite component 1 according to the present embodiment, the insulating layer 13 is disposed in a recess between the component electrodes 10b, thus unevenness between the component electrodes 10b is flattened. Accordingly, in forming the adhesive layer during manufacturing the composite component 1, formation of a void due to insufficient intrusion of the adhesive into the recess is suppressed. As a result, a position gap of the electronic component 10 due to expansion, contraction and movement of a void and poor connection between the through-Si via 7 and the component electrode 10b due to a void entering underneath the through-Si via 7 are suppressed. Thus, with the composite component 1 according to the present embodiment, a decrease in reliability of an electronic device in which the composite component 1 is used can be inhibited.

In addition, in the composite component 1 according to the present embodiment, a thickness of the Si base layer can be decreased and a length of a via wiring line from the redistribution layer 5 to the component electrode 10b is shorter than that in the related art (for example, about 100 μm), thus parasitic impedance due to the via wiring line can be reduced, and electrical characteristics of the electronic device in which the composite component 1 is used can be improved. Examples of such a reduction in the electrical characteristics include, in a semiconductor element IC mounted on the redistribution layer, a reduction in a function of suppressing power supply voltage fluctuation for the semiconductor element IC driven at high speed and a reduction in a function of absorbing high-frequency ripples.

The composite component 1 can be integrally configured with a package substrate (not illustrated) for modularization as necessary, for example. For example, the composite component 1 is fixed onto the package substrate using a solder bump to be modularized together with the package substrate. Thus, a module product such as a semiconductor package can be manufactured. As illustrated in FIG. 1, in the composite component 1, the electronic component 10 is fixed inside the interposer structure 2. That is, the composite component 1 is an electronic component built-in type composite component. In the composite component 1, an interposer electrode layer 15 having the interposer electrode 16 forming a solder bump is planar. Thus, a large number of solder bumps can be disposed.

(Electronic Component and Electronic Component Layer)

The electronic component 10 has the third main surface 10c and a fourth main surface 10d opposite to each other and the component electrode 10b disposed on the third main surface 10c. The electronic component 10 is, for example, an electronic component in which one or more elements are integrated in a substance similar to that forming the Si base layer 3. Examples of the electronic component 10 include active components (more specifically, a CPU, a GPU, an LSI, and the like) and passive components (more specifically, a capacitor, a resistor, an inductor, and the like). The electronic component 10 alone constitutes an electronic component layer 9. That is, the composite component 1 according to the first embodiment includes the electronic component layer 9 constituted by the electronic component 10. Dimensions of the electronic component 10 in the X direction and the Y direction are substantially the same as dimensions of the Si base layer 3 in the X direction and the Y direction, respectively.

The electronic component 10 is provided between the interposer electrode 16 and the Si base layer 3. In the electronic component 10, the component electrode 10b and the surface on which the insulating layer 13 is disposed are bonded to the second main surface 3b of the Si base layer 3 with the adhesive layer 11 interposed therebetween.

Another electronic component can be further stacked and mounted on the electronic component layer 9 in the composite component 1, by being electrically connected to the interposer electrode 16. Note that although one electronic component 10 is fixed inside the interposer structure 2 as the electronic component layer 9 in FIG. 1 and FIG. 2, another electronic component may be stacked on the electronic component layer 9 to include two or more electronic components. The two or more electronic components may be of types identical to each other or different from each other.

The electronic component 10 is constituted by an electronic component body portion 10a and the component electrode 10b but may further have an under bump metal (UBM) between the electronic component body portion 10a and the component electrode 10b.

The component electrode 10b is connected to the through-Si via 7 for electrical connection. Examples of a conductive material of the component electrode 10b include Cu, Ni, Sn, Al, and alloys containing these. Among them, the conductive material is preferably the same material as that of the through-Si via. A thickness of the component electrode 10b is, for example, 1 μm to 30 μm and preferably equal to or less than 5 μm. The thickness of the component electrode 10b can be decreased to 1 to 5 μm.

The surface roughness Rz of an upper surface of the component electrode 10b is preferably equal to or less than 1.0 μm and more preferably equal to or less than 0.5 μm. The surface roughness Rz can be determined by surface profilometry by light interferometry.

In a cross section parallel to a stacking direction (the Z direction) of the interposer structure 2 and the electronic component 10, crystal grains of the component electrode 10b preferably increase in size from a side where the component electrode 10b is in contact with the through-Si via 7 toward a side opposite thereto. When the crystal grains of the component electrode 10b are relatively small on the contact side, the joining property of the component electrode 10b with the through-Si via 7 is improved. This is presumed as follows. The fact that the crystal grains of the component electrode 10b are relatively small on the contact side means that a cross-sectional area occupied by a boundary between the crystal grains (crystal grain boundary) is relatively large on the contact side. The crystal grain boundary is unstable in terms of energy, thus is in a state of being easily joined. The cross-sectional area occupied by the crystal grain boundary which is active in joining in the component electrode 10b is relatively large on the contact side as described above, thus it is considered that the joining property of the component electrode 10b with the through-Si via 7 is improved.

When, for example, a crystal grain in contact with the through-Si via 7 and a crystal grain adjacent to that crystal grain with one crystal grain boundary interposed therebetween are taken as the crystal grains on the contact side in the component electrode 10b, a size of the crystal grain (crystal grain size) on the contact side is equal to or greater than 1 nm and equal to or less than 1 μm (i.e., from 1 nm to 1 μm). When a crystal grain on the side opposite to the side in contact with the through-Si via 7 is, for example, a crystal grain in contact with the electronic component body portion 10a, a size of the crystal grain (crystal grain size) on the side opposite to the contact side is equal to or greater than 3 μm and equal to or less than 10 μm (i.e., from 3 μm to 10 μm).

The crystal grain size is obtained by a measurement method in compliance with Japanese Industrial Standard (JIS) G0551 "Steel—Microscopic Test Method for Grain Size (Planimetric Method)" and is calculated using JISG0551: 2020 3.4 The Number of Intersections, P (Intersection). In this measurement method, in a cross section (ZX cross section) parallel to the above-described stacking direction (Z direction) of the composite component 1, the number of intersections P of a crystal grain boundary on the contact side of the component electrode 10b and one straight or curved test line is obtained. A crystal grain size is calculated by dividing a line length LT used for the measurement by P. This is repeated a plurality of times at three locations to obtain an average diameter of the crystal grains. The obtained average diameter of the crystal grains is taken as a crystal grain size. Similarly, a crystal grain size on the opposite side is obtained. Further, the above-described magnitude relationship can be determined by comparing the obtained crystal grain sizes on the contact side and the opposite side.

Means for forming such a magnitude relationship between the crystal grain sizes on the contact side and the opposite side include making the crystal grains on the contact side finer by work-hardening. Examples of such work-hardening include grinding (polishing) of the component electrode 10b and the insulating layer 13 in a flattening step of a method for manufacturing the composite component 1 to be described below. In the flattening step, stress due to the grinding (for example, a shearing stress) is selectively applied to the upper surface of the component electrode 10b, thus, a crystal grain is made finer as compared with portions other than the upper surface.

(Interposer Structure)

The interposer structure 2 includes the Si base layer 3 and the interposer electrode 16 provided apart from the Si base layer 3, and the electronic component 10 is provided between the Si base layer 3 and the interposer electrode 16. The interposer structure 2 relays, for example, between a package substrate and the electronic component 10, having different terminal pitches.

To be more specific, the interposer structure 2 has the Si base layer 3 having the first main surface 3a and the second main surface 3b opposite to each other, the redistribution layer 5 formed on the first main surface 3a, the through-Si via 7 being a through-electrode electrically connected to the redistribution layer 5 and penetrating the inside of the Si base layer 3, the interposer electrode 16 facing the second main surface 3b, the adhesive layer 11 and the insulating layer 13.

(Si Base Layer)

The Si base layer 3 has the first main surface 3a and the second main surface 3b opposite to each other. A thickness of the Si base layer 3 is, for example, equal to or greater than 3 μm and equal to or less than 20 μm (i.e., from 3 μm to 20 μm). On the other hand, a thickness of a Si base layer in a composite component of the related art is about 100 μm, for example. The reason why the thickness of the Si base layer 3 can be made extremely small as described above is that in the method for manufacturing the composite component 1 to be described later, strength is reinforced by pasting a Si support 19 to the Si base layer 3, thus even when the Si base layer 3 is thinned by grinding, breakage (cracking or the like) of the Si base layer 3 due to insufficient strength is less likely to occur. This is because the Si support 19 is pasted to the second main surface 3b of the Si base layer 3 before the Si base layer 3 is ground (see FIG. 4F). Reinforcing the strength by the Si support 19 makes it possible to manufacture the composite component 1. Since the thickness of the Si base layer 3 can be made extremely thin as compared with the related art, a length of the via wiring line electrically connecting the component electrode 10b of the electronic component 10 to the redistribution layer 5 can be decreased. The Si base layer 3 is substantially formed of Si.

(Redistribution Layer)

The redistribution layer 5 is formed on the first main surface 3a of the Si base layer 3. The redistribution layer 5 is a multilayer wiring layer. The redistribution layer 5, for example, converts a wiring layout of the through-Si via 7 on a side of the first main surface 3a of the Si base layer 3 into a component electrode layout of another electronic component to be disposed on the redistribution layer 5. That is, the through-Si via 7 and the other electronic component to be disposed on the redistribution layer 5 are electrically connected to each other with the redistribution layer 5 interposed therebetween to form a desired electric circuit. The redistribution layer 5 includes a wiring line and a dielectric film 21. The wiring line contains a conductive material. Examples of the conductive material include Cu, Ag, Au, and an alloy containing them, and among them, Cu is preferable. The redistribution layer 5 may include a plurality of layers, and for example, has two or more layers of conductive wiring lines and one or more layers of dielectric films. A thicknesses of each of one conductive wiring line and one dielectric film constituting the redistribution layer 5 is, for example, from 1.5 μm to 5.0 μm. In this case, a thickness of the redistribution layer 5 is a value (unit: μm) obtained by multiplying the thickness of the one layer (1.5 μm to 5.0 μm) by the total number of layers in the redistribution layer 5.

The wiring line has a conductive via. The conductive via electrically connects wiring lines between different layers in the redistribution layer 5. The dielectric film is formed to contain an insulating material. Examples of the insulating material include an organic insulating material and an inorganic insulating material. Examples of the organic insulating material include an epoxy resin, a silicone resin, polyester, polypropylene, polyimide, an acrylonitrile-butadiene-styrene (ABS) resin, an acrylonitrile-styrene (AS) resin, a methacrylic resin, polyamide, a fluorine resin, liquid crystal polymer, polybutylene terephthalate and polycarbonate. Examples of the inorganic insulating material include silicone oxide ($SiO_2$) and silicon nitride (SiN, $Si_3N_4$).

The thickness of the dielectric film is, for example, 0.1 to 2 The dielectric film may be a multi-component film containing two or more components. The multi-component film may be a multilayer film in which a plurality of layers is formed in a component-by-component manner. Layers of the multilayer film are structured in an order of, for example, $SiO_2$ (0.25 μm thick)/$Si_3N_4$ (0.1 μm thick)/$SiO_2$ (0.25 μm thick)/$Si_3N_4$ (0.1 μm thick) from a side of the Si base layer 3.

(Through-Si Via)

The through-Si via 7 is electrically connected to the redistribution layer 5 and penetrates the inside of the Si base layer 3. The through-Si via 7 has a through-Si via body portion 7a and an extending portion 7b. The through-Si via body portion 7a is electrically connected to the redistribution layer 5 and penetrates the inside of the Si base layer 3. The extending portion 7b is electrically connected to the through-Si via body portion 7a, extends from the second main surface 3b of the Si base layer 3, penetrates the inside of the adhesive layer 11 and is electrically connected to the component electrode 10b. As described above, the via wiring line electrically connecting the component electrode 10b to the redistribution layer 5 is constituted only by the through-Si via 7, thus does not have a solder bump. Accordingly, in the composite component 1 according to the present embodiment, the parasitic impedance due to the via wiring line can be further reduced. Further, this also improves electronic characteristics of the electronic device in which the composite component 1 is used. Further, since the length of the wiring line can be reduced as compared with the related art, the thickness of the composite component 1 can be decreased and the composite component 1 can be reduced in size and thickness. The length of the via wiring line (that is, a length in a stacking direction of the through-Si via 7) is, for example, 3 μm to 36 μm.

In FIG. 2, the through-Si via 7 is linear in the stacking direction. A cross-sectional shape of the through-Si via 7 in a ZX plane is rectangular in FIG. 2 but is not limited thereto and may be a tapered shape in the stacking direction. Further, examples of a cross-sectional shape of the through-Si via 7 in an XY plane include a substantially circular shape, a substantially polygonal shape and a substantially polygonal shape with rounded corners.

Note that the via wiring line may further include a conductive pillar (not illustrated) in addition to the through-Si via 7. That is, the conductive pillar electrically connects the through-Si via 7 to the component electrode 10*b*. The conductive pillar is preferably formed of the same conductive material as the conductive material forming the through-Si via 7. In this case, it is possible to reduce connection resistance between the through-Si via 7 and the component electrode 10*b*. Accordingly, the electrical characteristics of the electronic device in which the composite component 1 is used are improved. Examples of a shape of the conductive pillar may include a cylinder and a prism with an interface with the component electrode 10*b* as a bottom surface. The conductive pillar preferably contains the same type of conductive material as that of the through-Si via 7 and the component electrode 10*b*. Since the conductive pillar contains the same type of conductive material, the connection resistance can be further reduced. The through-Si via 7 is formed of, for example, Cu, Ag, Au, or an alloy thereof as a conductive material. The conductive pillar and the through-Si via 7 are preferably formed of Cu as the conductive material. The conductive pillar may be provided on the component electrode 10*b* of the electronic component 10 before the electronic component layer 9 is disposed on the Si base layer 3.

FIG. 1 depicts that four through-Si vias 7 are electrically connected to one component electrode 10*b*, but the present disclosure is not limited thereto. For example, one to three through-Si vias 7 or five or more through-Si vias 7 may be electrically connected to one component electrode 10*b*. Among them, preferably, two or more through-Si vias 7 are electrically connected to one component electrode. When two or more through-Si vias 7 are electrically connected to one component electrode 10*b*, parasitic impedance between the redistribution layer and the electronic component is further reduced, and electrical characteristics of an electronic device in which the interposer is used are improved.

When a cross-sectional shape of the component electrode 10*b* is substantially rectangular in a plane orthogonal to the stacking direction of the composite component 1 (the XY plane), and a cross-sectional shape of the through-Si via 7 in the plane is substantially circular, a diameter φ of the through-Si via 7 preferably satisfies the following Expression (1):

$$T(Si) + (T(A) - H(C))/3 \le \varphi \le r \qquad (1)$$

[where, in Expression (1), T(Si) represents the thickness of the Si base layer 3, T(A) represents a thickness of the adhesive layer 11, H(C) represents a height of the component electrode 10*b*, and r represents a diameter of a circle inscribed in the cross-sectional shape of the component electrode 10*b* at an interface between the through-Si via 7 and the component electrode 10*b*].

In the present specification, the diameter of the through-Si via 7 refers to a diameter of the through-Si via 7 at the interface between the through-Si via 7 and the component electrode 10*b*. When a conductive pillar is formed on the component electrode 10*b*, the diameter of the through-Si via 7 is a diameter of the through-Si via 7 at an interface between the through-Si via 7 and the conductive pillar.

Further, when the conductive pillar is formed on the component electrode 10*b*, the height of the component electrode 10*b* also includes a height of the conductive pillar.

Further, the diameter of the circle inscribed in the cross-sectional shape of the component electrode 10*b* at the interface between the through-Si via 7 and the component electrode 10*b* refers to a diameter of a circle inscribed in a cross-sectional shape of the component electrode 10*b* in an XY cross-section of the composite component 1 illustrated in FIG. 2 at the interface between the through-Si via 7 and the component electrode 10*b*. When the conductive pillar is formed on the component electrode 10*b*, the diameter of the circle inscribed in the cross-sectional shape of the component electrode 10*b* is a diameter of a circle inscribed in a cross-sectional shape of the component electrode 10*b* at an interface between the conductive pillar and the component electrode 10*b*. Here, when the cross-sectional shape of the component electrode 10*b* is substantially rectangular, the inscribed circle is a circle that is a circle in contact with a long side of the substantially rectangular shape at two points.

When the diameter φ of the through-Si via 7 is equal to or greater than a lower limit value of Expression (1), the diameter φ of the through-Si via 7 is large, and thus, parasitic impedance of the through-Si via 7 is reduced, and the electrical characteristics of the electronic device in which the composite component 1 is used are improved. In addition, when the diameter φ of the through-Si via 7 is equal to or less than an upper limit value of Expression (1), electrical connection between the through-Si via 7 and the component electrode 10*b* is further improved, and a short-circuit can be effectively inhibited.

From the viewpoint of further reducing the parasitic impedance of the through-Si via 7, as a preferable aspect, a maximum diameter of the extending portion 7*b* in the XY plane is more preferably larger than a maximum diameter of the through-Si via body portion 7*a* in the XY plane. The maximum diameter of the through-Si via 7 is, for example, the diameter of the through-Si via 7 at an interface with the redistribution layer 5.

In order to achieve the above-described preferable aspect, for example, as illustrated in FIG. 2, the extending portion 7*b* of the through-Si via 7 may have a substantially elliptical cross-sectional shape in the ZX plane. The preferable aspect can be achieved by adjusting an etching rate to vary between a material forming the adhesive layer 11 and a material forming the Si base layer 3 in the through-hole forming step of the method for manufacturing the composite component 1 to be described later. To be more specific, in FIG. 4L, as the material forming the adhesive layer 11, a material which is easily etched with respect to the material forming the Si base layer 3 is selected.

The maximum diameter of the extending portion 7*b* in the XY plane is preferably larger than a minimum diameter of the through-Si via body portion 7*a* in the XY plane. In such a case, the parasitic impedance of the through-Si via 7 is reduced, and the electrical characteristics of the electronic device in which the composite component 1 is used are improved. The minimum diameter of the through-Si via body portion 7*a* is, for example, a cross-sectional diameter of the through-Si via 7 in the XY plane including an interface between the Si base layer 3 and the adhesive layer 11.

(Interposer Electrode Layer and Interposer Electrode)

When another electronic component can be mounted on the composite component 1, the interposer electrode layer 15 is a layer interposed between the composite component 1 and the other electronic component. Further, when the composite component 1 is mounted on an electronic device, the interposer electrode layer 15 is a layer interposed between the composite component 1 and the electronic device. The interposer electrode layer 15 has the interposer electrode 16 and a dielectric film. The interposer electrode 16 electrically connects between the composite component 1 and the other electronic component or the electronic device, and the dielectric film electrically isolates necessary portions between the composite component 1 and the other electronic component or the electronic device. The interposer electrode 16 faces the second main surface 3*b* of the Si base layer 3. The interposer electrode 16 is, for example, Cu, Ag and Au and alloy containing them, and among them, Cu is preferable. Electrical connection between the interposer electrode 16 and the electronic device is implemented by a solder bump. The interposer electrode 16 may have a plating layer of Ni or Au on a surface thereof in order to be adapted to the solder bump.

(Adhesive Layer)

The adhesive layer 11 bonds and fixes the electronic component 10 to an inside of the interposer structure 2. To be more specific, the adhesive layer 11 bonds the component electrode 10*b* of the electronic component 10 to the second main surface 3*b* of the Si base layer 3. The thickness of the adhesive layer 11 is, for example, equal to or less than 10 μm and preferably equal to or less than 5 μm. In the present embodiment, by providing the insulating layer 13 as described later, the thickness of the adhesive layer 11 can be decreased to 1 to 5 μm. In the present specification, the thickness of the adhesive layer 11 refers to a thickness in the Z direction from the upper surface of the component electrode 10*b* to the second main surface 3*b* of the Si base layer 3. When the thickness of the adhesive layer 11 is equal to or less than 10 μm, the thickness of the composite component 1 is decreased. Thus, the electronic component in which the composite component 1 is used can be reduced in size and thickness. In addition, the DC resistance (Rdc) and the thermal resistance are reduced, and the characteristics of the electronic component module are improved. The thickness of the adhesive layer 11 is obtained as follows. A cross section (ZX cross section) of the composite component 1 as illustrated in FIG. 2 is formed, and an SEM image is captured using a scanning electron microscope. In the SEM image, the thickness of the adhesive layer 11 is measured a plurality of times (the number of measurements n≥5). An average value of a plurality of measured values obtained is taken as the thickness of the adhesive layer 11.

(Insulating Layer)

The insulating layer 13 is disposed between component electrodes of the plurality of component electrodes 10*b* of the electronic component 10. Thus, the insulating layer 13 functions as a layer that electrically insulates two component electrodes 10*b* from each other.

Figure 3:
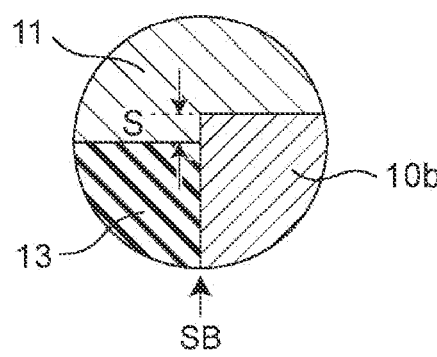
FIG. 3 is an enlarged view of a part B of FIG. 2.

The insulating layer 13 will be described further with reference to FIG. 3. FIG. 3 is an enlarged view of the part B of FIG. 2. As illustrated in FIG. 2 and FIG. 3, the insulating layer 13 is disposed in a recess formed between two component electrodes 10*b*. By disposing the insulating layer 13 as described above, a level difference S at an interface between the component electrode 10*b* and the insulating layer 13 is reduced, and the unevenness between the component electrodes 10*b* is flattened. In the electronic component bonding step of the method for manufacturing the composite component 1 to be described later, formation of a void due to insufficient intrusion of the adhesive into the recess is suppressed. As a result, a position gap of the electronic component 10 along with a change in volume of a void generated in the solidification step of the adhesive or movement of a void and poor connection between the through-Si via 7 and the component electrode 10*b* due to a void entering underneath the through-Si via 7 are suppressed. Thus, with the composite component 1 according to the present embodiment, a decrease in the reliability of the electronic device in which the composite component 1 is used can be inhibited.

The level difference S between an upper surface of the insulating layer 13 and the upper surface of the component electrode 10*b* in the cross section (ZX cross section) parallel to the stacking direction (Z direction) of the interposer structure 2 and the electronic components 10 is preferably equal to or less than 1.0 μm, and more preferably equal to or less than 0.5 μm. In the present specification, the level difference S refers to an absolute value of a difference between a height of the upper surface of the insulating layer 13 and a height of the upper surface of the component electrode 10*b* at an interface SB between the insulating layer 13 and the component electrode 10*b* as illustrated in FIG. 3. When the level difference S is equal to or less than 1.0 μm, flatness of a surface formed by the component electrode 10*b* and the insulating layer 13 (surface bonded to the adhesive layer 11) is further improved, and thus formation of a void is further suppressed. Thus, with the composite component 1 according to the present embodiment, a decrease in the reliability of the electronic device in which the composite component 1 is used can be further inhibited.

In addition, when the level difference S is equal to or less than 1.0 μm, the flatness of the surface formed by the component electrode 10*b* and the insulating layer 13 (surface bonded to the adhesive layer 11) is further improved, thus the adhesive layer 11 does not substantially need to compensate for the level difference S, and the thickness of the adhesive layer 11 can be decreased. Thus, a length of a via wiring line can be decreased, and DC resistance Rdc and thermal resistance are reduced. Accordingly, with the composite component 1 according to the present embodiment, the characteristics of the electronic component module can be further improved. In addition, since the thickness of the adhesive layer 11 can be decreased, the composite component 1 according to the present embodiment can be reduced in size and thickness.

The level difference S equal to or less than 1.0 μm can be achieved by, for example, grinding the insulating layer 13 and the component electrode 10*b* at the same time, in the flattening step of the method for manufacturing the composite component 1 to be described later.

The surface roughness Rz of the insulating layer 13 is preferably equal to or less than 1.0 μm and more preferably equal to or less than 0.5 μm. Preferably, the surface roughness Rz of both the insulating layer 13 and the component electrode 10*b* is equal to or less than 1.0 μm and more preferably equal to or less than 0.5 μm. In this case, the flatness of the surface formed by the component electrode 10*b* and the insulating layer 13 (the surface bonded to the adhesive layer 11) is improved. Accordingly, with the composite component 1 according to the present embodiment, a decrease in reliability of the electronic device in which the composite component 1 is used can be further inhibited and the composite component 1 can be further reduced in size and thickness. The surface roughness Rz of the upper surface of the insulating layer 13 can be determined by surface profilometry by light interferometry in the same manner as the surface roughness Rz of the component electrode 10*b*.

The insulating layer 13 is configured to contain an insulating material. Such an insulating material is similar to the insulating material described for the redistribution layer 5. Among components forming the insulating layer 13 and the redistribution layer 5 (strictly, the dielectric film constituting the redistribution layer 5), common components preferably occupy equal to or greater than 80% by weight, more preferably equal to or greater than 90% by weight, still more preferably equal to or greater than 95% by weight and particularly preferably 100% by weight. When the common components occupy equal to or greater than 80% by weight, linear expansion coefficients of the materials forming the redistribution layer 5 and the insulating layer 13 are substantially the same. That is, when most of the components forming the redistribution layer 5 and the insulating layer 13 are common to each other (when the insulating layer 13 is formed of substantially the same insulating material as that of the redistribution layer 5), expansion degrees of the redistribution layer 5 and the insulating layer 13 when being heated are substantially the same. Accordingly, in the composite component 1 according to the present embodiment, distortion due to a difference between coefficients of linear expansion during heating (for example, heating during manufacturing or operation of the composite component 1) and a warp of the composite component 1 as a whole are reduced, and reliability is improved. An absolute value of a ratio of the difference between the coefficient of linear expansion of the insulating layer 13 and the coefficient of linear expansion of the redistribution layer 5 is preferably equal to or less than 20%, more preferably equal to or less than 10%, still more preferably equal to or less than 5% and particularly preferably 0%. The absolute value of the ratio of the difference between the coefficient of linear expansion of the insulating layer 13 and the coefficient of linear expansion of the redistribution layer 5 can be represented by |[the coefficient of linear expansion of redistribution layer 5–the coefficient of linear expansion of insulating layer 13]×100/ (the coefficient of linear expansion of the insulating layer 13)|(%). Note that when the insulating layer 13 is formed of a plurality of types of materials, the coefficient of linear expansion of the insulating layer 13 is a weighted average of coefficients of linear expansion of the respective materials according to contents of the respective materials. When the dielectric film of the redistribution layer 5 is formed of a plurality of types of materials, a weighted average is similarly obtained.

In addition, in another embodiment, preferably, the redistribution layer 5 is formed of an inorganic material, and the insulating layer 13 is formed of an organic material. In such a case, since the redistribution layer 5 is formed of an inorganic material, a thin film and fine wiring for the redistribution layer 5 can be achieved, and the insulating layer 13 is formed of an organic material, thus can be formed at low cost. Accordingly, in the above-described embodiment, total costs can be reduced. An example of such an aspect is a composite component in which the redistribution layer 5 is formed of $SiO_2$ as the inorganic material, and the insulating layer 13 is formed of a polyimide resin as the organic material.

In addition, in another embodiment, preferably, the redistribution layer 5 is formed of an organic material, and the insulating layer 13 is formed of an inorganic material. In this case, since the redistribution layer 5 is formed of an organic material and can be formed at low cost, the total costs can be reduced. In addition, since the insulating layer 13 is formed of the inorganic material, the thickness thereof can be decreased as compared with an organic material, in manufacturing, and thus further lower RDC and ESR can be achieved. An example of such an aspect is a composite component in which the redistribution layer 5 is formed of a polyimide resin as the organic material, and the insulating layer 13 is formed of $SiO_2$ as the inorganic material.

The thickness of the insulating layer 13 is, for example, 1 to 30

(Insulating Film, Diffusion Preventing Film, Seed Layer and Protective Layer)

The interposer structure 2 may further include an insulating film, a diffusion preventing film, a seed layer, and a protective layer. The insulating film, the diffusion preventing film and the protective layer can be disposed, for example, between the through-Si via body portion 7*a* and the Si base layer 3 and between the extending portion 7*b* and the adhesive layer 11. The insulating film inhibits a short circuit between the through-Si vias 7 illustrated in FIG. 2, for example. For example, the insulating film contains an insulating material such as $SiO_2$. The diffusion preventing film is a layer for inhibiting diffusion of the conductive material forming the through-Si via 7 to the Si base layer 3 and the adhesive layer 11, and for example, contains a transition metal such as Ta and a nitride of a transition metal such as TaN. The seed layer is a layer used when the through-Si via 7 is formed by electrolytic plating. In the present embodiment, since a void is less likely to be formed near a connection portion of the through-Si via 7, poor formation of the seed layer before plating of the through-Si via 7 is suppressed. As a result, poor connection between the through-Si via 7 and the component electrode 10*b* is suppressed. The seed layer is, for example, a conductive material such as Cu. The protective layer is a layer that suppresses surface oxidation of the conductive material forming the through-Si via 7 and protects the through-Si via 7. The protective layer contains insulating silicon compounds such as SiN and SiCN. A thickness of the seed layer is, for example, 0.01 to 0.20 Specific examples of the protective layer include SiN (0.15 μm thick) and SiCN (0.02 μm thick).

As described above, the insulating films include, for example, a first insulating film located between the through-Si via 7 and the Si base layer 3 and a second insulating film located between the adhesive layer 11 and the Si base layer 3. A thickness of the second insulating film is preferably smaller than a thickness of the first insulating film, whereby the diameter of the through-Si via 7 in the adhesive layer 11 can be further increased. Accordingly, the parasitic impedance of the through-Si via 7 is further reduced, and the electrical characteristics of the electronic device in which the composite component 1 is used are improved.

[Method for Manufacturing Composite Component]

Next, the method for manufacturing the composite component 1 will be described.

The method for manufacturing the composite component 1 includes a filling step of filling a space between the component electrodes 10*b* of the electronic component 10 with an insulating material, a flattening step of performing flattening treatment on a surface of the component electrode 10*b* and the insulating material to form the insulating layer 13 between the component electrodes 10*b*, and an electronic component bonding step of forming the adhesive layer 11 on the Si base layer 3 and bonding the electronic component 10 onto the Si base layer 3 such that the component electrode 10b and the insulating layer 13 face the Si base layer 3 with the adhesive layer 11 interposed therebetween. The method further includes a through-hole forming step of forming a through-hole 25 in the Si base layer 3 and the adhesive layer 11 by etching to expose the component electrode 10b of the electronic component 10, and a through-Si via forming step of forming the through-Si via 7 in the through-hole 25 by electrolytic plating.

With the method for manufacturing the composite component 1, a composite component that can inhibit a decrease in the reliability of the electronic device in which the composite component 1 is used can be provided. In the filling step and the flattening step, the insulating layer 13 is disposed in a recess between the component electrodes 10b, thus unevenness between the component electrodes 10b is flattened. Accordingly, in the electronic component bonding step, formation of a void due to insufficient intrusion of the adhesive into the recess is suppressed. As a result, a component position gap due to expansion, contraction, and movement of a void and poor connection between the through-Si via 7 and the component electrode 10b due to a void entering underneath the through-Si via 7 are suppressed. Thus, with the method for manufacturing the composite component 1, a composite component that can inhibit a decrease in the reliability of the electronic device in which the composite component 1 is used can be provided.

The method for manufacturing the composite component 1 may further include a Si base layer preparing step of preparing the Si base layer 3, a Si support pasting step of pasting the Si support 19 onto the electronic component 10 bonded onto the Si base layer 3, a Si base layer thinning step of thinning the Si base layer 3 facing the Si support 19 with the electronic component 10 interposed therebetween, an electronic component thinning step of grinding and thinning an electronic component 10, and a dielectric film forming step of forming the dielectric film 21 having a predetermined pattern on the Si base layer 3. The method also includes a redistribution layer forming step of forming the redistribution layer 5, an interposer electrode forming step of forming the interposer electrode 16, and a dicing step of dividing into individual pieces by cutting with a dicing machine.

Figure 4A:
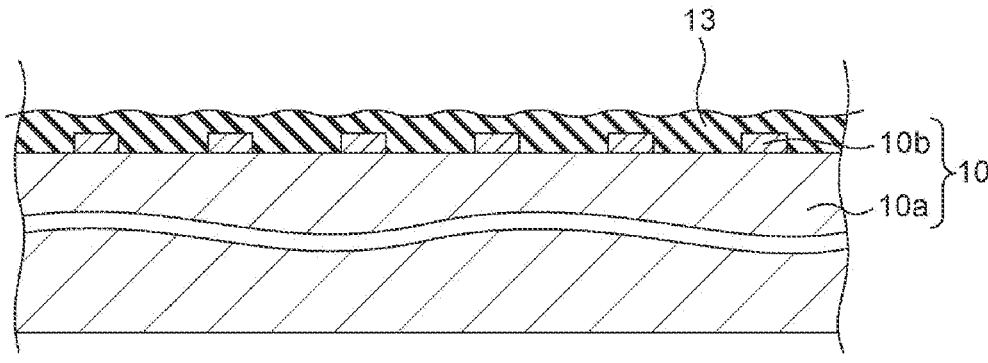
FIG. 4A is an explanatory diagram for explaining a method for manufacturing the composite component.
Figure 4B:
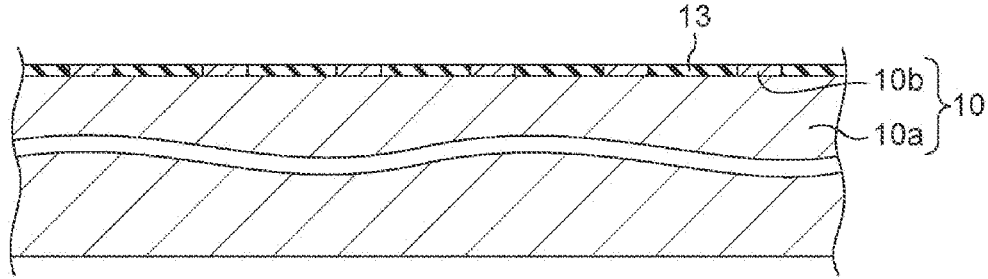
FIG. 4B is an explanatory diagram for explaining the method for manufacturing the composite component.

In particular, an example of the method for manufacturing the composite component 1 will be described with reference to FIG. 4A to FIG. 4N. FIG. 4A to FIG. 4N are diagrams for explaining the method for manufacturing the composite component 1. The method for manufacturing the composite component 1 according to the first embodiment includes the filling step, the flattening step, the Si base layer preparing step, the electronic component bonding step, the electronic component thinning step, the Si support pasting step, the Si base layer thinning step, the dielectric film forming step, the through-hole forming step, the through-Si via forming step, the redistribution layer forming step, the interposer electrode forming step and the dicing step.

Note that in this manufacturing method, a mother integrated body in which the composite components 1 are integrated is manufactured in the filling step to the interposer electrode forming step.

(Filling Step)

In the filling step, a space between the component electrodes 10b of the electronic component 10 is filled with an insulating material. When the insulating layer 13 formed of an organic insulating material is formed, as illustrated in FIG. 4A, for example, a coating film is formed by applying a liquid solution containing the organic insulating material and a solvent using a spin coating method. Here, a lowest portion of the coating film is made higher than a highest portion of the component electrode 10b. That is, the coating film is formed such that a plurality of the component electrodes 10b as a whole is completely buried in the coating film. A coating film is dried to form the insulating layer 13. Preferably, the insulating layer 13 before the flattening step completely covers the component electrode 10b. Further, when the insulating layer 13 formed of an inorganic insulating material is formed, for example, a raw material containing an element forming the inorganic insulating material is formed by a vapor phase growth (CVD) method.

Note that before performing the filling step, for example, a metallic layer can be formed on a surface of the component electrode 10b by plating and sputtering to increase the thickness of the component electrode 10b. Since the component electrode 10b and the insulating layer 13 are ground and thinned in the flattening step that follows, a ground amount can be increased by increasing the thickness of the component electrode 10b. This facilitates adjustment of the flattening (for example, a size of the level difference S and the surface roughness Rz of an upper surface of the component electrode 10b and an upper surface of the insulating layer 13). A material forming the metallic layer is a conductive material having low electric resistance, and examples include Cu, Al, Ni and Au.

(Flattening Step)

In the flattening step, the surface of the component electrode 10b and a surface of the insulating material are subjected to flattening treatment to form the insulating layer 13 between the component electrodes 10b. For example, as illustrated in FIG. 4B, the component electrode 10b and the insulating layer 13 are ground using a surface planer and a grinder to flatten the insulating layer 13 and expose and flatten the component electrode 10b. The size of the level difference S and the surface roughness Rz of the upper surface of the component electrode 10b and the upper surface of the insulating layer 13 can be adjusted by grinding conditions.

The grinding of the component electrode 10b in the flattening step is not only to flatten a surface formed by the component electrode 10b and the insulating layer 13 but also to make crystal grains of the upper surface of the component electrode 10b finer to enhance joining activity of the component electrode 10b. This makes it possible to form favorable joining between the component electrode 10b and the through-Si via 7 in the through-Si via forming step that follows. In addition, since stress due to grinding is selectively applied to the upper surface of the component electrode 10b, a crystal grain at the upper surface of the component electrode 10b is made finer, and as a result, the crystal grain becomes smaller as compared with portions other than the upper surface.

(Si Base Layer Preparing Step)

In the Si base layer preparing step, a Si wafer is prepared for the Si base layer 3. A shape of the Si wafer may be a cylindrical shape but is not limited thereto. When the shape of the Si wafer is a cylindrical shape, examples of a thickness of the Si wafer include 755 μm (a diameter φ300 mm of the Si wafer), 725 μm (φ200 mm), 625 μm (φ150 mm) and 525 μm (φ100 mm). Note that the Si base layer preparing step may be performed before the filling step.

(Electronic Component Bonding Step)

In the electronic component bonding step, the adhesive layer 11 is formed on the Si base layer 3, and the electronic component 10 is bonded onto the Si base layer 3 such that the component electrode 10*b* and the insulating layer 13 face the Si base layer 3 with the adhesive layer 11 interposed therebetween. An adhesive is applied on the Si base layer 3, the electronic component 10 is disposed thereon, and the adhesive is solidified. Thus, the electronic component 10 is bonded onto the Si base layer 3 to form the adhesive layer 11. As described above, in the present embodiment, the electronic component 10 is the electronic component layer 9. To be more specific, as illustrated in FIG. 4C, a coating film 12 of the adhesive is formed on the second main surface 3*b* of the Si base layer 3. In this way, a coating film-formed Si base layer is produced. A coating method is, for example, a spin coating method. Control and application are preferably performed such that a thickness of the coating film 12 is in a range from the thickness of the component electrode 10*b* of the electronic component 10 to 10 μm. The adhesive is, for example, a thermosetting resin. Such a thermosetting resin is, for example, a thermosetting resin containing benzocyclobutene (BCB) as a repeating unit and can be obtained by polymerizing, for example, 1,3-divinyl-1,1,3,3-tetramethyldisiloxane-bis-benzocyclobutene (DVS-bis-BCB). Examples of commercially available products include "CYCLOTENE" manufactured by Dow Chemical.

Note that in the electronic component bonding step, before the electronic component 10 is disposed on the Si base layer 3, a conductive pillar may be provided on the component electrode 10*b* of the electronic component 10.

As illustrated in FIG. 4D, the electronic component 10 is disposed at predetermined position on the coating film 12 by using a device provided with a vacuum chamber. Specifically, a wafer on which a plurality of the electronic components 10 is integrated (electronic component-integrated wafer) is pasted to the coating film-formed Si base layer 3. Pressure is applied bidirectionally along the stacking direction of the electronic component 10, and heating is performed. Specifically, the coating film-formed Si base layer 3 is set on a lower stage in the vacuum chamber of the device. The electronic component 10 is vacuum-suctioned to an upper stage in the vacuum chamber such that the component electrode 10*b* of the electronic component 10 faces the coating film 12. When aligning the coating film-formed Si base layer 3 and the electronic component-integrated wafer, for example, a recognition mark of the Si base layer 3 is used. The electronic component 10 is disposed on a side of the coating film 12 of the coating film-formed Si base layer. Pressure is applied bidirectionally along directions in which the upper and lower stages are opposed to each other, and heating is performed.

The electronic component-integrated wafer is bonded onto the Si base layer 3 such that the component electrode 10*b* and the insulating layer 13 face the Si base layer 3 with the adhesive layer 11 interposed therebetween. Here, a surface corresponding to a pasting surface of the electronic component-integrated wafer is the surface formed by the component electrode 10*b* and the insulating layer 13 and has the flatness due to the above-described flattening step. When the electronic component-integrated wafer is pasted to the coating film-formed Si base layer, the coating film formed on the Si base layer is easily pasted along a flat surface shape of the pasting surface of the above-described wafer. This suppresses the insufficient pasting of the adhesive of the coating film along the shape of the pasting surface, and generation of an air gap due to entering of the air may be suppressed.

The heating (adhesive curing) is performed by heating a set of the Si base layer 3 (the Si wafer/the adhesive/the electronic component) to which the electronic component 10 is pasted with the adhesive for an hour using, for example, a hot plate heated to 250° C. or a hot air circulating oven. Accordingly, the adhesive is solidified to form the adhesive layer 11. The coating film 12 can be preliminary solidified (adhesive soft curing) after the pasting and before solidifying the adhesive. The preliminary solidification is performed, for example, by heating the pasted Si base layer 3 for 15 minutes using a hot plate heated to 150° C. A vacuum void in the adhesive layer 11 can be removed by the preliminary solidification.

Note that the Si base layer 3 can be treated before or after forming the coating film 12. Examples of pre-treatment include cleaning treatment and adhesion improving treatment. In the cleaning treatment, the second main surface 3*b* of the Si base layer 3 is cleaned to remove contaminants. In the adhesion improving treatment, an adhesion improving agent (for example, "AP3000" manufactured by DOW) is applied to the second main surface 3*b* to form the coating film 12. Accordingly, adhesion between the second main surface 3*b* and the coating film 12 is improved. Post-treatment is, for example, preliminary heating (soft-baking) treatment. After forming the coating film 12, the preliminary heating is performed to stabilize the coating film 12. In the preliminary heating, the coating film 12 is heated for about 60 seconds using, for example, a hot plate heated to 80° C. to 150° C. Further, the recognition mark can be formed on the Si base layer 3. The recognition mark is used for the alignment between the Si base layer 3 and the electronic component 10 when the electronic component 10 is bonded to the Si base layer 3 in the subsequent step.

(Electronic Component Thinning Step)

As illustrated in FIG. 4E, in the electronic component thinning step, the electronic component 10 is ground and thinned using, for example, a back-grinder. In the electronic component thinning step, a surface of the electronic component 10 on which the component electrode 10*b* is not disposed is ground. An amount of grinding is preferably as large as possible but is adjusted so as not to damage functional portions inside the electronic component 10. The functional portions are, for example, a dielectric and an electrode in a case of a capacitor or wiring lines in a case of an inductor. A thickness of the electronic component layer 9 after the thinning is, for example, 50 to 150 μm.

In the electronic component thinning step, after grinding the electronic component 10, a flattening treatment can be performed as final finishing. Examples of the flattening treatment include dry polishing and Chemical Mechanical Polishing (CMP). For example, flatness of the fourth main surface 10*d* ground by the flattening treatment can be represented by a Total Thickness Variation (TTV). A polished surface of the electronic component 10 subjected to the flattening treatment has a thickness of equal to or less than 2 μm, with respect to the thickness of 5 μm of the adhesive layer 11 to be formed in a step that follows. For example, when polishing treatment is performed on the electronic component 10 in which the y 300 mm Si wafer is used, the TTV of the polished surface of the electronic component 10 is 1.5 μm.

(Si Support Pasting Step)

Figure 4F:
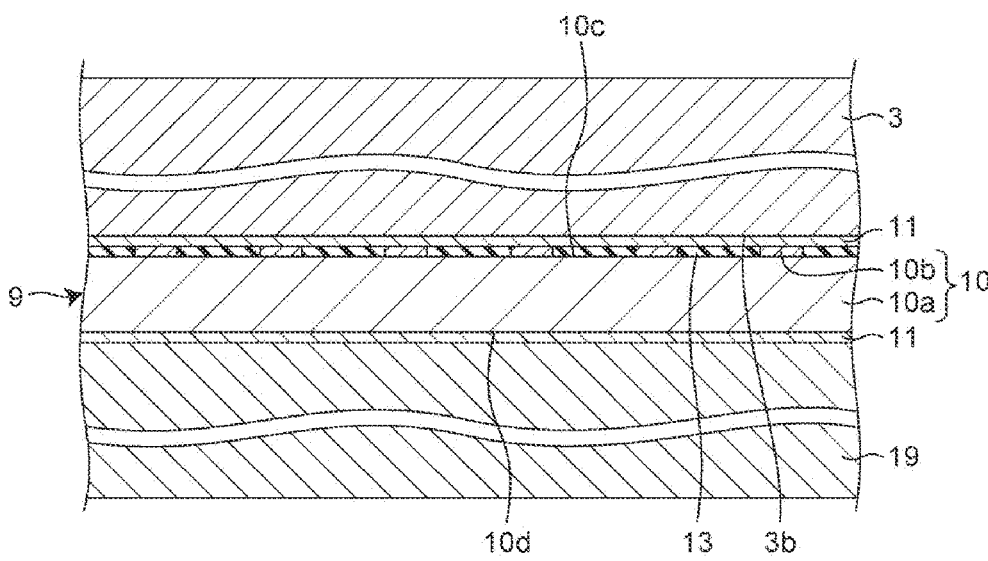
FIG. 4F is an explanatory diagram for explaining the method for manufacturing the composite component.

In the Si support pasting step, as illustrated in FIG. 4F, the Si support 19 is pasted onto the electronic component 10 bonded onto the Si base layer 3. Specifically, the Si wafer described in the Si base layer preparing step is separately prepared as the Si support 19. Next, the coating film 12 of the adhesive is formed on the Si support 19 by the method described in the electronic component bonding step. Thereafter, the electronic component 10 is pasted onto the Si support 19 such that the ground surface (fourth main surface 10*d*) of the electronic component 10 is in contact with the coating film 12, and pressure is applied for heating. Thus, the Si support 19 is formed on the ground surface of the electronic component 10. The purpose of providing the Si support 19 is to inhibit occurrence of an adverse effect (more specifically, a decrease in strength or the like) due to a fact that a layer in the manufacturing process is thinner than that in the related art in the Si base layer thinning step that follows.

The Si support 19 can be thinned before pasting as necessary from the viewpoint of improving workability. This is because a dielectric film is formed using a semiconductor device in a subsequent step. For example, when the thickness of the electronic component 10 is 150 µm, a Si wafer (φ300 mm, a general thickness of 775 µm) as the Si support 19 is thinned to about 625 µm.

(Si Base Layer Thinning Step)

Figure 4G:
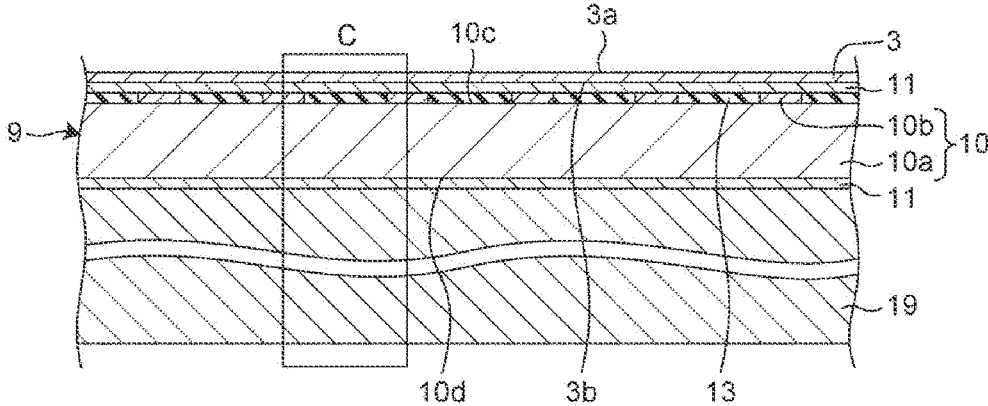
FIG. 4G is an explanatory diagram for explaining the method for manufacturing the composite component.

In the Si base layer thinning step, as illustrated in FIG. 4G, the Si base layer 3 facing the Si support 19 with the electronic component 10 interposed therebetween is thinned. Specifically, the Si base layer 3 is ground by a similar method to the electronic component thinning step to thin the Si base layer 3 and flatten the ground surface. In the Si base layer thinning step, since the Si base layer 3 is thinned in a state of being supported by the Si support 19, the Si base layer 3 can be effectively thinned. Accordingly, with the method for manufacturing the composite component 1 according to the present embodiment, the composite component 1 which is excellent as an electronic component module and is reduced in thickness and size can be manufactured. An amount of grinding is preferably as large as possible within the scope that the above-described adverse effect can be inhibited and, for example, certain strength can be maintained. In consideration of variations in flatness of the ground surface, the thickness of the Si base layer 3 after thinning is preferably equal to or greater than 3 µm. In consideration of variations in flatness of a polished surface, when the flatness of the polished surface is 2 µm, the thickness of the Si base layer 3 after thinning is more preferably equal to or greater than 5 µm, and still more preferably equal to or greater than 10 µm.

(Dielectric Film Forming Step)

Figure 4H:
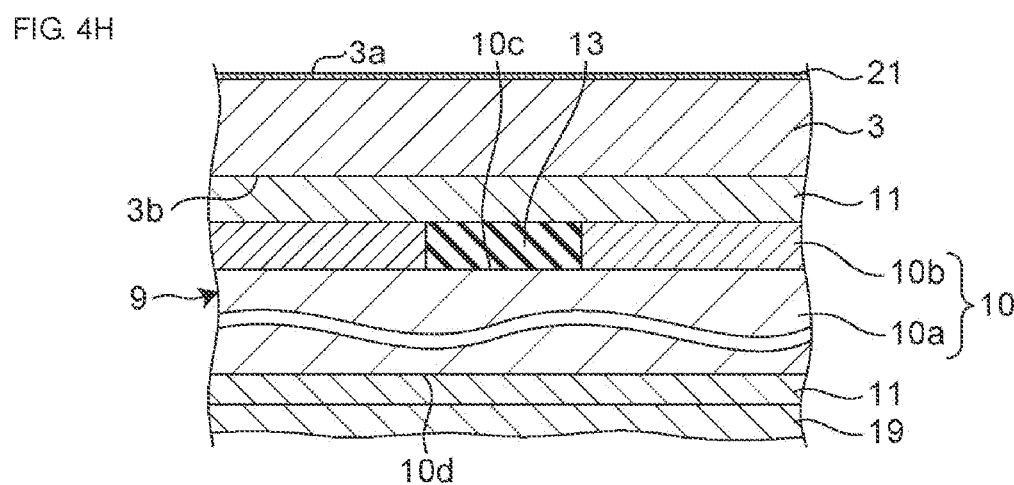
FIG. 4H is an explanatory diagram for explaining the method for manufacturing the composite component.
Figure 4I:
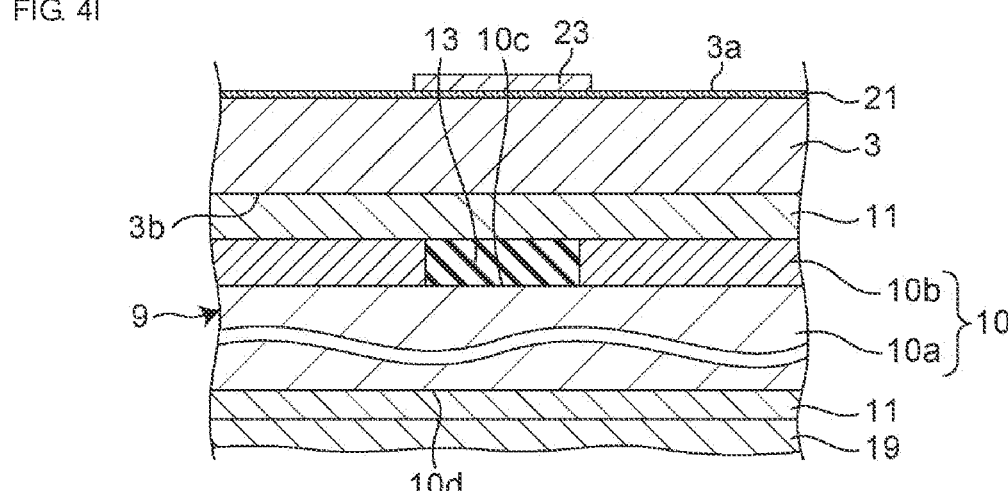
FIG. 4I is an explanatory diagram for explaining the method for manufacturing the composite component.
Figure 4J:
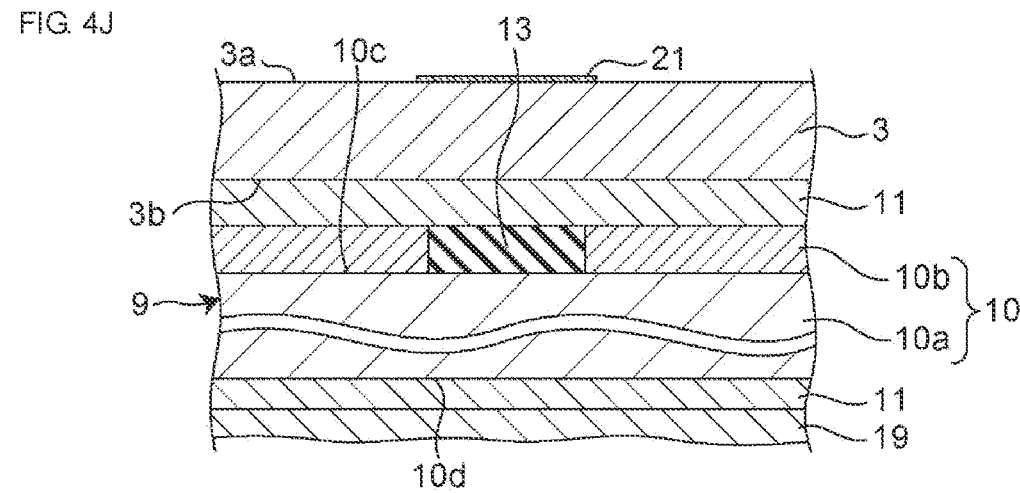
FIG. 4J is an explanatory diagram for explaining the method for manufacturing the composite component.

In the dielectric film forming step, as illustrated in FIG. 4H, FIG. 4I and FIG. 4J, the dielectric film 21 having a desired pattern is formed on the Si base layer 3. To be more specific, the dielectric film (0.1 to 0.2 µm thick) 21 is formed on an entire surface of the Si base layer 3 as illustrated in FIG. 4H, using a vapor phase growth (CVD) method such as PECVD. One or more layers of the dielectric films 21 may be formed. For example, when four layers of the dielectric films 21 are formed, an order of $SiO_2$: 0.25 µm/$Si_3N_4$: 0.1 µm/$SiO_2$: 0.25 µm/$Si_3N_4$ 0.1 µm from a side of the Si base layer 3 can be adopted.

In addition, in the dielectric film forming step, a surface of the Si base layer 3 can be cleaned before the dielectric film 21 is formed. Examples of the cleaning include wet cleaning and oxygen plasma ashing.

Note that FIG. 4H to FIG. 4N are enlarged as compared with FIG. 4A to FIG. 4G. FIG. 4H to FIG. 4N illustrate a part corresponding to a part C of FIG. 4G.

Next, as illustrated in FIG. 4I, the dielectric film 21 is patterned using photolithography. A liquid resist is spin-coated to form a photoresist film 23 on an entire surface of the dielectric film 21. The photoresist film 23 is exposed through a mask corresponding to a desired pattern. The exposed photoresist film 23 is developed. Reactive Ion Etching (RIE) is used to selectively remove the dielectric film 21 of the photoresist film 23. For example, when the above-described four layers of dielectric films are formed, two layers on a surface side of the dielectric film 21 (surface side of the dielectric film facing a side of the Si base layer 3) are selectively removed. Thereafter, the photoresist film 23 is peeled off. Thus, the dielectric film 21 having the desired pattern illustrated in FIG. 4J is formed on the Si base layer 3. The dielectric film 21 functions as an insulating film that electrically insulates two through-Si vias 7 illustrated in FIG. 2.

Note that the first main surface 3*a* of the Si base layer 3 may further have a mark layer. The mark layer can be detected by an IR camera for alignment in a photolithographic method.

(Through-Hole Forming Step)

Figure 4K:
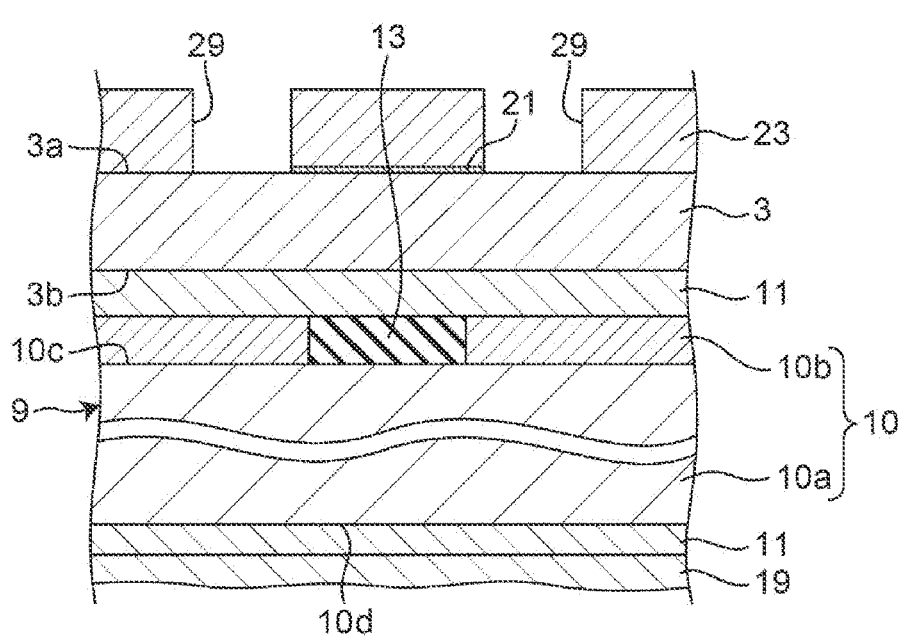
FIG. 4K is an explanatory diagram for explaining the method for manufacturing the composite component.
Figure 4L:
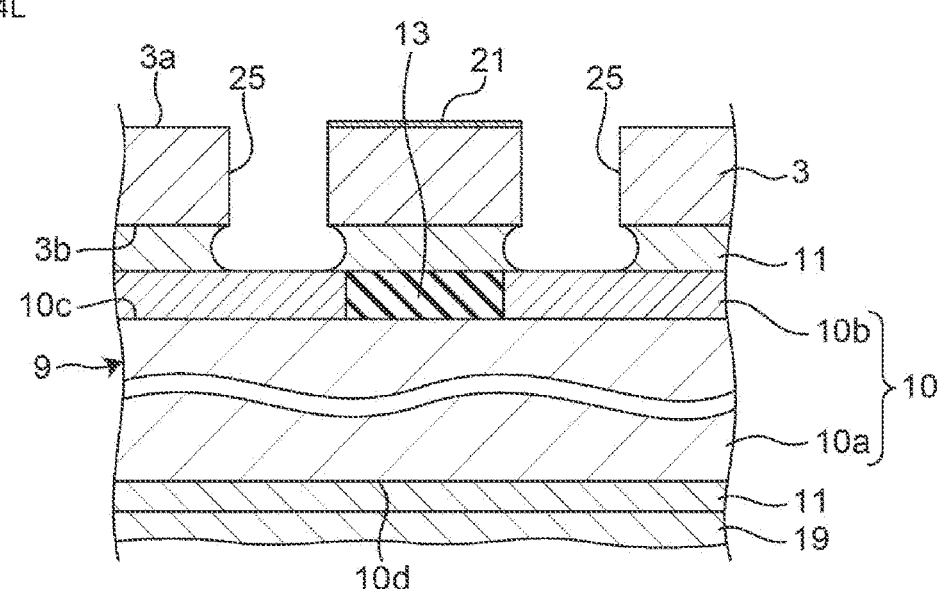
FIG. 4L is an explanatory diagram for explaining the method for manufacturing the composite component.

In the through-hole forming step, as illustrated in FIG. 4K and FIG. 4L, the through-hole 25 is formed in the Si base layer 3 and the adhesive layer 11 by etching. Specifically, the photoresist film 23 is formed on an entire surface. The photoresist film 23 is exposed through a mask corresponding to a pattern of the through-Si via 7. The exposed photoresist film 23 is developed to form the photoresist film 23 having a predetermined pattern as illustrated in FIG. 4K. As illustrated in FIG. 4L, the Si base layer 3 and the adhesive layer 11 existing in the Z direction from a cavity 29 of the photoresist film 23 are selectively removed (etched). The etching is performed using, for example, RIE. Accordingly, the through-hole 25 is formed, and (part of the upper surface of) the component electrode 10*b* is exposed. Here, the through-hole 25 has an elliptical shape in the adhesive layer 11. This is because the material forming the adhesive layer 11 is more easily etched as compared with the material forming the Si base layer 3. Accordingly, the extending portion 7*b* in an elliptical shape is formed in the through-Si via forming step that follows. After the through-hole 25 is formed, the photoresist film 23 is removed.

The through-hole forming means of the present disclosure includes, for example, etching such as RIE but does not include laser irradiation. When etching such as RIE is used as the through-hole forming means, the flatness of the upper surface of the component electrode 10*b* exposed from the formed through-hole 25 is maintained. Accordingly, the component electrode 10*b* and the through-Si via 7 formed in the through-Si via forming step that follows form favorable joining, thereby improving reliability of electrical connection. On the other hand, when laser irradiation is used as the through-hole forming means, excessive energy may be applied to the upper surface of the component electrode 10*b* exposed from the through-hole 25. Accordingly, the upper surface of the component electrode 10*b* is melted, or the surface roughness of the upper surface of the component electrode 10*b* is reduced. When the flatness of the upper surface of the component electrode 10*b* is reduced, the component electrode 10*b* cannot be favorably joined to the through-Si via 7, and the reliability of the electrical connection is decreased.

(Through-Si Via Forming Step)

Figure 4M:
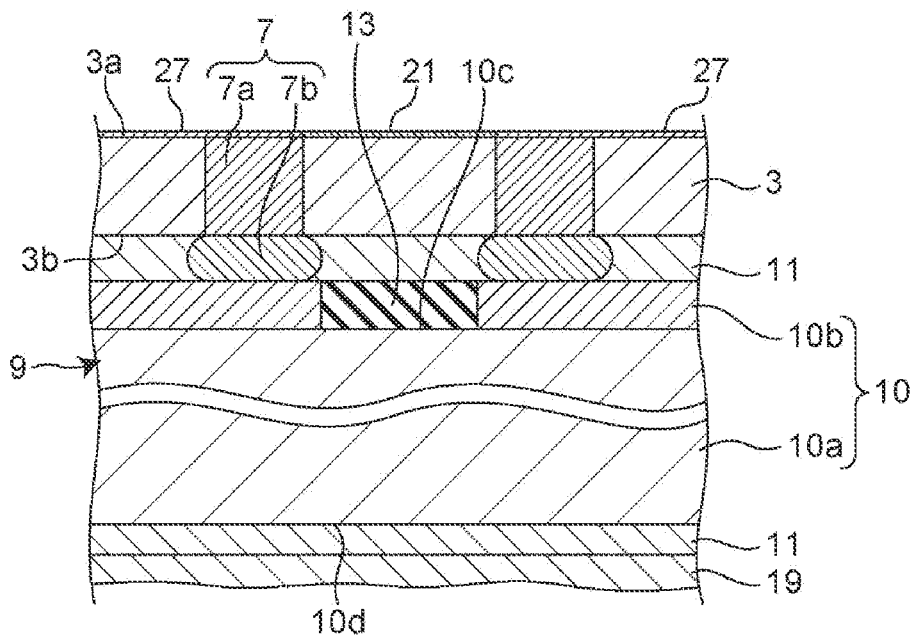
FIG. 4M is an explanatory diagram for explaining the method for manufacturing the composite component.
Figure 4N:
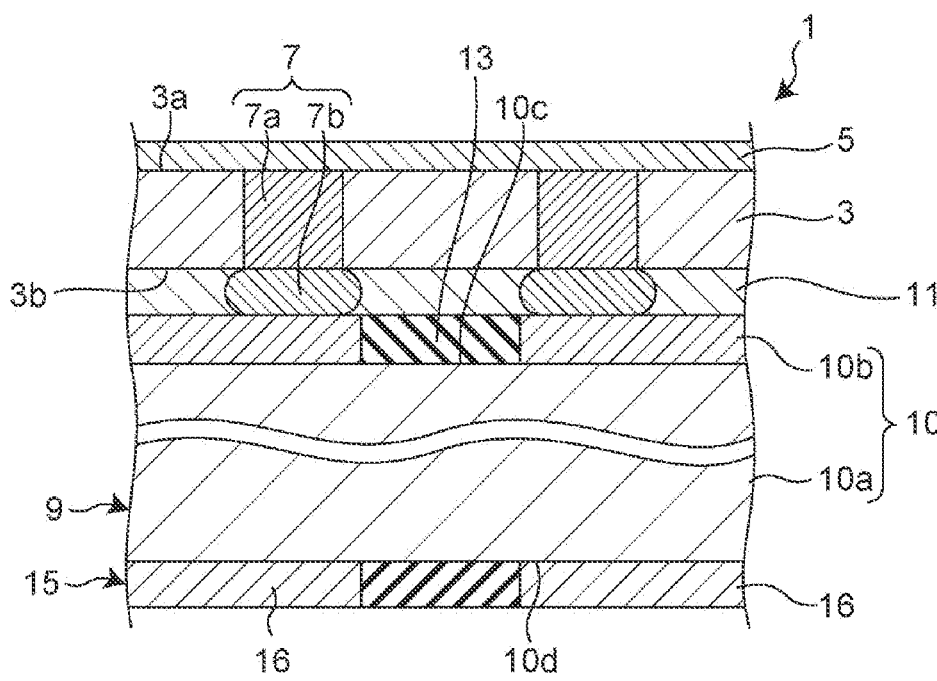
FIG. 4N is an explanatory diagram for explaining the method for manufacturing the composite component.

In the through-Si via forming step, as illustrated in FIG. 4M, the through-Si via 7 is formed in the through-hole 25. The through-Si via 7 is formed in the through-hole 25 by electrolytic plating (more specifically, electrolytic Cu plating) using a dual damascene method (more specifically, a Cu dual damascene method).

Here, the through-Si via forming step may further include an insulating film forming step, a diffusion preventing film forming step, a protective layer forming step and a seed layer forming step before the through-Si via 7 is formed. In the insulating film forming step, an insulating film is formed on a surface (inner wall surface) where the Si base layer 3 is exposed in the through-hole 25 illustrated in FIG. 4L before forming the through-Si via 7. In the diffusion preventing film forming step, a diffusion preventing film is formed on the insulating film. In the protective layer forming step, a protective layer is formed on the diffusion preventing film. The protective layer functions as a protective layer for the conductive material (more specifically, Cu or the like) forming the through-Si via 7 and suppresses surface oxidation of the conductive material. The seed layer is a layer through which electricity flows when the through-Si via 7 is formed by electrolytic plating. The seed layer is, for example, a conductive material such as Cu.

In addition, the through-Si via forming step may include a flattening step after forming the through-Si via 7. In the flattening step, a top surface of the through-Si via 7 is flattened using, for example, CMP.

(Redistribution Layer Forming Step and Interposer Electrode Forming Step)

In the redistribution layer forming step, as illustrated in FIG. 4M and FIG. 4N, a dielectric film and a wiring line 27 having a predetermined pattern are formed by the above-described photolithography method and etching to form the redistribution layer 5. In addition, in the interposer electrode forming step, the Si support 19 and the adhesive layer 11 are removed to form the interposer electrode 16. Note that in the redistribution layer forming step, thinning treatment for the Si support 19 may be performed instead of removing the Si support 19 and the adhesive layer 11. In the thinning treatment, for example, the Si support 19 is ground to make a thickness of the Si support 19 equal to the thickness of the Si base layer 3. When the thickness of the Si support 19 is made equal to the thickness of the Si base layer 3 as described above, the Si support 19 and the Si base layer 3 are substantially plane-symmetrical with respect to the electronic component layer 9. Thus, the warp of the composite component 1 is further reduced. Note that the dielectric film 21 formed in FIG. 4H to FIG. 4J and the wiring line 27 formed in FIG. 4M are incorporated in the redistribution layer 5 and depicted in FIG. 4N.

(Dicing Step)

In the dicing step, the mother integrated body is divided with a dicing machine into individual pieces. Thus, the composite component 1 is manufactured.

EXAMPLES

Example 1

The composite component 1 illustrated in FIG. 2 was produced in accordance with the above-described method for manufacturing the composite component 1. To be specific, the insulating layer 13 formed of an organic insulating material (polyimide) was formed so as to cover the component electrode 10b of the electronic component 10. The insulating layer 13 and the component electrode 10b were ground to flatten the insulating layer 13 and to expose and flatten the component electrode 10b. The surface roughness Rz of upper surfaces of the insulating layer 13 and the component electrode 10b thus formed was 0.3 μm.

The adhesive layer 11 was formed using an adhesive ("CYCLOTENE" manufactured by Dow Chemical), and the electronic component 10 was caused to adhere onto the Si base layer 3. A thickness of the formed adhesive layer 11 was 3 μm. A thickness of the component electrode 10b of the electronic component 10 was 2 μm. The electronic component 10 was ground to have a thickness of 100 μm. The Si support 19 was pasted onto the thinned electronic component 10, and the Si base layer 3 was thinned by grinding. A thickness of the thinned Si base layer 3 was 10 μm.

The dielectric film 21 having a predetermined pattern was formed on the thinned Si base layer 3. The photoresist film 23 was formed on the Si base layer 3, and the through-hole 25 was formed in the Si base layer 3 and the adhesive layer 11 by RIE. An insulating film, a diffusion preventing film and a seed layer were sequentially formed on inner walls of the Si base layer 3 and the adhesive layer 11 in the through-hole 25. The Si base layer 3 and the adhesive layer 11 existing in the Z direction from the cavity 29 of the photoresist film 23 were selectively removed by using a Cu dual damascene method. Accordingly, part of the upper surface of the component electrode 10b was exposed via the through-hole 25. The through-Si via 7 was formed by Cu electrolytic plating. Thus, the through-Si via 7 connected to the component electrode 10b was formed.

Figure 8:
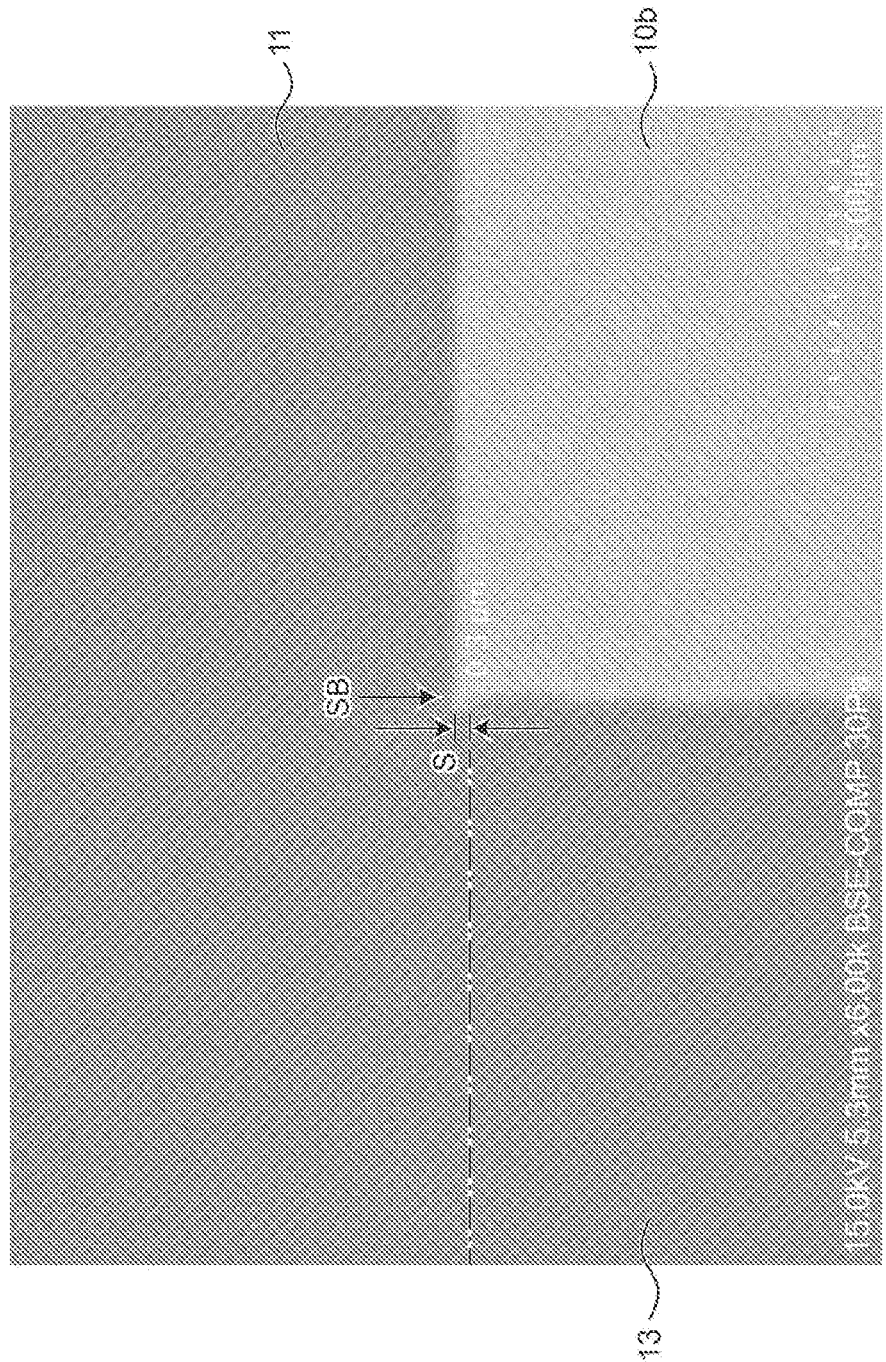
FIG. 8 is an enlarged sectional view of a composite component of Example 1.

The formed through-Si via 7 had a diameter of 10 μm. A thickness of the extending portion 7b was 3 μm, and a cross-sectional shape (shape in a ZX cross-section) of the extending portion 7b was elliptical. Five layers of the redistribution layers 5 were formed on the Si base layer 3. A dielectric film of the redistribution layer 5 was formed of an organic insulating material (polyimide). Among components forming the redistribution layer 5 and the insulating layer 13, a ratio of common components was 100% by weight. A thickness of the redistribution layer 5 was 2.5 μm (0.5 μm×5). A wiring line from the redistribution layer 5 to the component electrode 10b was constituted only by the through-Si via 7. A length of the wiring line in the Z direction was 13 μm. Thereafter, the Si support 19 was peeled off, and the interposer electrode 16 was formed on the peeled electronic component 10. A thickness of the interposer electrode 16 was 5 μm. A thickness of the produced composite component 1 was 117.5 μm. FIG. 8 is an enlarged sectional view of the composite component 1 of Example 1 and corresponds to FIG. 3 illustrating the composite component 1 of the first embodiment. As shown in FIG. 8, the level difference S between the upper surface of the insulating layer 13 and the upper surface of the component electrode 10b was 0.3 μm, and the upper surface of the component electrode 10b was slightly higher than the insulating layer 13. Additionally, as shown in FIG. 8, the upper surface of the component electrode 10b was shown as a substantially straight line and had high flatness. Similarly, the upper surface of the insulating layer 13 indicated by an imaginary line had high flatness.

Figures 9A, 9B, 9C:
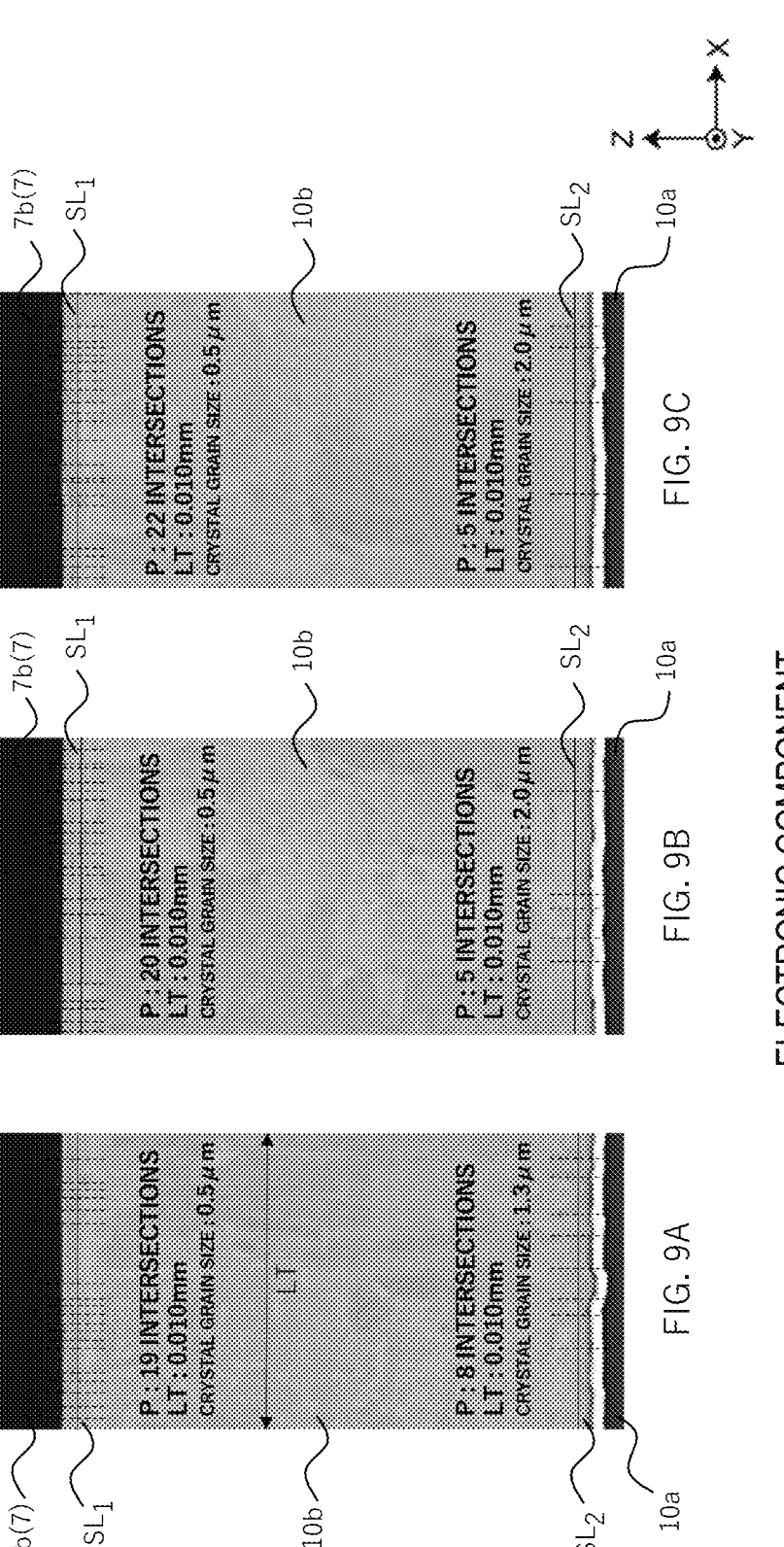
FIGS. 9A to 9C are enlarged sectional views of the composite component of Example 1.

A crystal grain size at the component electrode 10b was calculated in compliance with JIS G0551: 2020 3.4, The Number of Intersections, P (Intersection). Referring to FIGS. 9A to 9C, a method for measuring the crystal grain size will be described in detail. FIGS. 9A to 9C are enlarged sectional views of the composite component 1 of Example 1 and correspond to an enlarged view of a part F of FIG. 2. First, a crystal grain size on a contact side of the component electrode 10b was measured. In FIG. 9A, a test line $SL_1$ was created in a cross section (ZX cross section) parallel to the above-described stacking direction (Z direction) of the composite component 1. The test line $SL_1$ is a single straight line provided so as to be in contact with a crystal grain boundary on the contact side of the component electrode 10b, is parallel to the X direction and is substantially parallel to an interface between the component electrode 10b and the through-Si via 7. The test line $SL_1$ was located on a side of the component electrode 10b by 0.5 μm with respect to a contact surface between the component electrode 10b and the through-Si via 7. The number P (=19) of intersections between the test line $SL_1$ and the crystal grain boundaries (corresponding to intersections between the test line $SL_1$ and broken lines in FIGS. 9A to 9C) was determined. An average crystal size (=0.5 μm) was calculated by dividing a line length LT used for the measurement by P. The line length LT used for the measurement is a width of an image parallel to the X direction in FIG. 9A. Average crystal sizes were similarly measured at other locations illustrated in FIGS. 9B and 9C. The average crystal sizes obtained at the three locations were averaged to obtain an average value of the average crystal sizes (average diameter of the crystal grains) (=0.5 μm). The obtained average diameter of the crystal grains was taken as a crystal grain size on the contact side.

Note that in FIGS. 9A to 9C, a layer located between the component electrode 10b and the electronic component body portion 10a is a UBM.

Then, crystal grain sizes on an opposite side of the component electrode 10b were similarly measured, and an average value thereof was calculated (1.8 μm). A test line $SL_2$ was located on a side of the component electrode 10b by about 0.5 μm with respect to a contact surface between component electrode 10b and the UBM. In an interface between the component electrode 10b and the UBM illustrated in FIGS. 9A to 9C, a distance to the test line $SL_2$ from a point where the UBM is most convex toward the component electrode 10b (the upper side in the X direction) was 0.5 The test line $SL_2$ was a straight line parallel to the X direction and substantially parallel to the interface between the component electrode 10b and the through-Si via 7. Comparing the obtained crystal grain sizes, it was found that the crystal grain size (0.5 μm) on the contact side of the component electrode 10b was smaller than the crystal grain size (1.8 μm) on the opposite side of the component electrode 10b.

Example 2

Example 2 was produced in the same manner as in Example 1 except that the insulating layer 13 and the redistribution layer 5 were formed of an inorganic insulating material ($SiO_2$). The sizes of the composite component 1 of Example 2 were substantially the same as those of the composite component of Example 1 except that the thicknesses of the insulating layer 13 and the redistribution layer 5 were decreased.

Example 3

Example 3 was produced by the same method as that of Example 1 except that the redistribution layer 5 was formed of an inorganic insulating material ($SiO_2$). The sizes of the composite component 1 of Example 3 were substantially the same as those of the composite component of Example 1 except that the thickness of the redistribution layer 5 was decreased.

Example 4

Example 4 was produced in the same manner as in Example 1 except that the insulating layer 13 was formed of an inorganic insulating material ($SiO_2$). The sizes of the composite component 1 of Example 4 were substantially the same as those of the composite component of Example 1 in which the thickness of the insulating layer 13 was decreased.

Second Embodiment

Figures 5, 6:
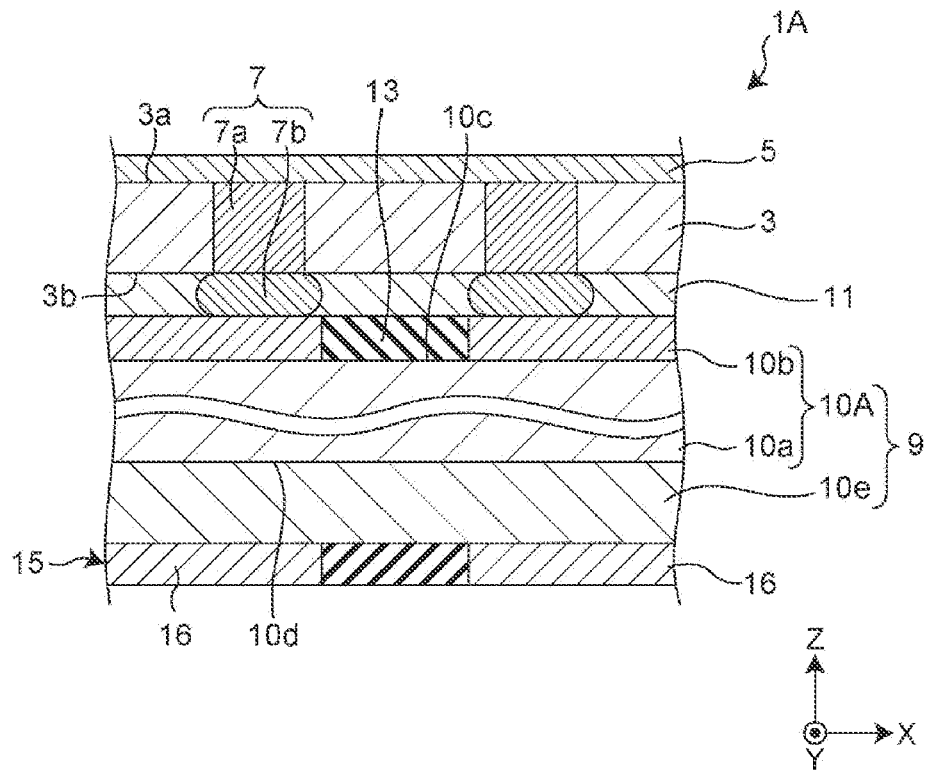
FIG. 5 is a sectional view illustrating a second embodiment of a composite component.
FIG. 6 is an enlarged view of a part D of FIG. 5.

A composite component 1A according to a second embodiment will be described with reference to FIG. 5 and FIG. 6. FIG. 5 is a sectional view of the second embodiment of the composite component 1A. FIG. 6 is a partially enlarged view (enlarged view of the part D) of FIG. 5. The second embodiment is different from the first embodiment in that the electronic component layer 9 is configured with an electronic component 10A and resin 10e for integrating the electronic component 10A. This different configuration will be described below. Note that in the second embodiment, the same reference numerals as those in the first embodiment denote the same components as those in the first embodiment, and thus a description thereof will be omitted.

[Configuration]

As illustrated in FIG. 6, in the composite component 1A of the second embodiment, the electronic component layer 9 is configured with the electronic component 10A and the resin 10e that integrates the electronic component 10A. That is, the composite component 1A of the second embodiment includes the electronic component layer 9 configured with the electronic component 10A and the resin 10e integrated with the electronic component 10A. In the composite component 1A of the second embodiment, since the electronic component 10A can be integrated with the resin 10e, even an electronic component having a dimension different from that of the Si base layer 3 (more specifically, a general-purpose electronic component) can be mounted. This makes it possible to use a low-cost and high-performance electronic component. In addition, design with a high degree of freedom is enabled, and it is possible to combine electronic components according to applications.

In addition, in FIG. 6, the electronic component layer 9 includes one electronic component 10A of one type, but is not limited thereto. The electronic component layer 9 may include two or more electronic components 10A of at least one type.

Preferably, the resin 10e is an epoxy resin, and the resin 10e further contains $SiO_2$ fillers dispersed in the resin 10e. In this case, a linear expansion coefficient of the electronic component layer 9 in which the electronic component 10A is integrated by the resin 10e can be made close to a linear expansion coefficient of the Si base layer 3. Accordingly, it is possible to reduce a warp of the composite component 1A at the time of manufacturing the composite component 1A and to improve reliability of the composite component 1A.

[Method for Manufacturing Composite Component 1A]

A method for manufacturing the composite component 1A according to the second embodiment includes a filling step of filling a space between the component electrodes 10b of the electronic component 10A with an insulating material, a flattening step of performing flattening treatment on a surface of the component electrode 10b and the insulating material to form the insulating layer 13 between the component electrodes 10b, an electronic component bonding step of forming the adhesive layer 11 on the Si base layer 3 and bonding the electronic component 10A onto the Si base layer 3 such that the component electrode 10b and the insulating layer 13 face the Si base layer 3 with the adhesive layer 11 interposed therebetween, and an electronic component sealing step of forming the electronic component layer 9 in which the electronic component 10A bonded onto the Si base layer 3 is sealed with the resin 10e and integrated. The method further includes a Si support forming step of pasting the Si support 19 onto the electronic component layer 9, a Si base layer thinning step of thinning the Si base layer 3 facing the Si support 19 with the electronic component layer 9 interposed therebetween, a through-hole forming step of forming the through-hole 25 in the thinned Si base layer 3 and the adhesive layer 11 by etching to expose the component electrode 10*b* of the electronic component 10A, and a through-Si via forming step of forming the through-Si via 7 in the through-hole 25 by electrolytic plating.

The method for manufacturing the composite component 1A may further include a Si base layer preparing step of preparing the Si base layer 3, an electronic component layer thinning step of grinding and thinning the electronic component layer 9, a dielectric film forming step of forming the dielectric film 21 having a predetermined pattern on the Si base layer 3, and a redistribution layer forming step of forming the redistribution layer 5. The method further includes an interposer electrode forming step of forming the interposer electrode 16, and a dicing step of dividing into individual pieces by cutting with a dicing machine.

Figure 7A:
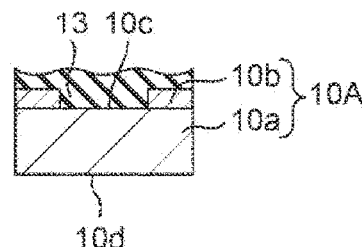
FIG. 7A is an explanatory diagram for explaining a method for manufacturing the composite component.
Figure 7B:
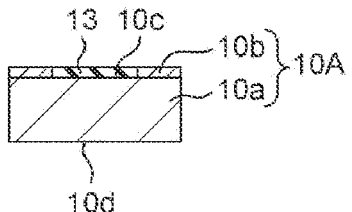
FIG. 7B is an explanatory diagram for explaining the method for manufacturing the composite component.
Figure 7C:
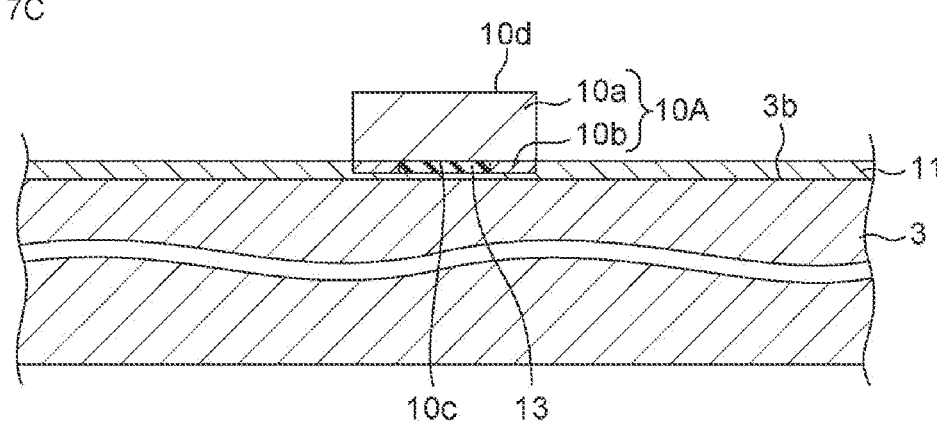
FIG. 7C is an explanatory diagram for explaining the method for manufacturing the composite component.

An example of the method for manufacturing the composite component 1A will be described with reference to FIG. 7A to FIG. 7N. FIG. 7A to FIG. 7N are diagrams for explaining the method for manufacturing the composite component 1A. The method for manufacturing the composite component 1A according to the second embodiment includes the filling step, the flattening step, the Si base layer preparing step, the electronic component bonding step, the electronic component sealing step, the electronic component layer thinning step, the Si support forming step, the Si base layer thinning step, the dielectric film forming step, the through-hole forming step, the through-Si via forming step, the redistribution layer forming step, the interposer electrode forming step and the dicing step.

(Filling Step and Flattening Step)

In the filling step, a space between the component electrodes 10*b* of the electronic component 10A is filled with an insulating material. For example, as illustrated in FIG. 7A, a space between the component electrodes 10*b* is filled with the insulating material so as to completely cover the component electrodes 10*b*. Thus, the insulating layer 13 formed of the insulating material is formed. In the flattening step, as illustrated in FIG. 7B, surfaces of the component electrodes 10*b* and the insulating material are subjected to flattening treatment to form the insulating layer 13 between the component electrodes 10*b*.

(Si Base Layer Preparing Step and Electronic Component Bonding Step)

The coating film 12 of an adhesive is formed on the Si base layer 3 in the same manner as in FIG. 4C. As illustrated in FIG. 7C, the electronic component 10A is mounted at a predetermined position on the coating film 12 by using a mounting device for the electronic component 10A. Pressure is applied bidirectionally along a stacking direction of the Si base layer 3, and heating is performed. To be specific, the electronic component 10A is vacuum-suctioned by using a head of the mounting device. The electronic component 10A is caused to face a coating surface of the component electrode 10*b*, aligned and the electronic component 10A is disposed. The Si base layer 3 on which the electronic component 10A is disposed is heated. Thus, the adhesive is solidified to form the adhesive layer 11 on the Si base layer 3, and the electronic component 10A is bonded onto the Si base layer 3. The component electrode 10*b* and the insulating layer 13 face the Si base layer 3 with the adhesive layer 11 interposed therebetween. Note that during heating, pressure may be applied bidirectionally along the stacking direction of the Si base layer 3.

(Electronic Component Sealing Step)

Figure 7D:
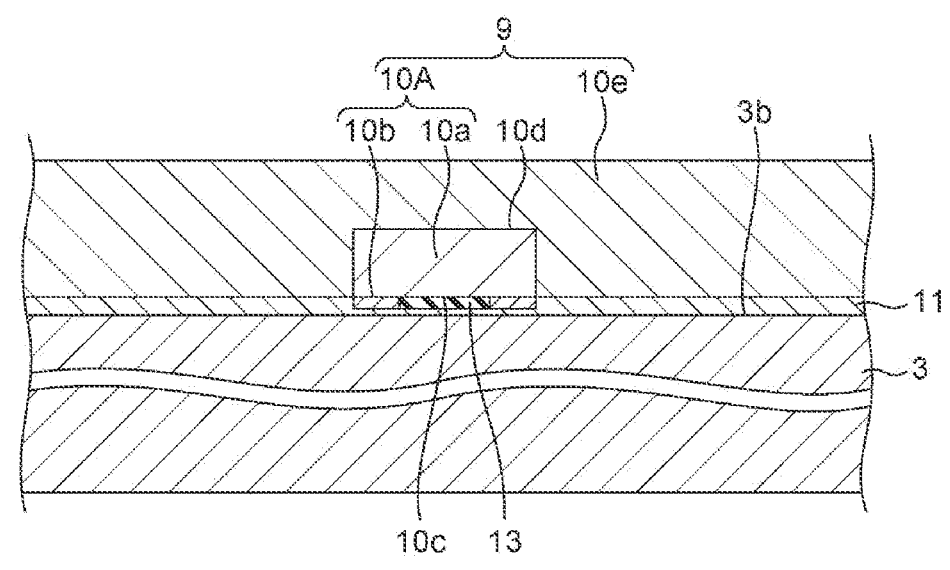
FIG. 7D is an explanatory diagram for explaining the method for manufacturing the composite component.

In the electronic component sealing step, as illustrated in FIG. 7D, the electronic component 10A bonded onto the Si base layer 3 is sealed with the resin (a sealing resin) 10*e*. Thus, the integrated electronic component layer 9 is formed. To be more specific, a dispenser is used to apply a liquid resin onto the Si base layer 3 on which the electronic component 10A is mounted. Thereafter, the applied resin is molded using a compression molding device. Thereafter, the resin is cured using, for example, a hot air circulating oven. Heat treatment conditions in the curing are, for example, 150° C. and an hour. In this way, the electronic component layer 9 is formed.

(Electronic Component Layer Thinning Step to Dicing Step)

Figure 7E:
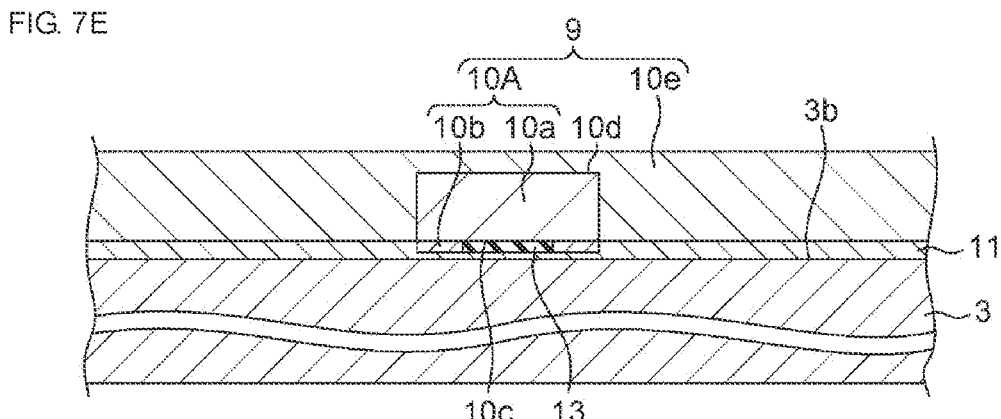
FIG. 7E is an explanatory diagram for explaining the method for manufacturing the composite component.
Figure 7F:
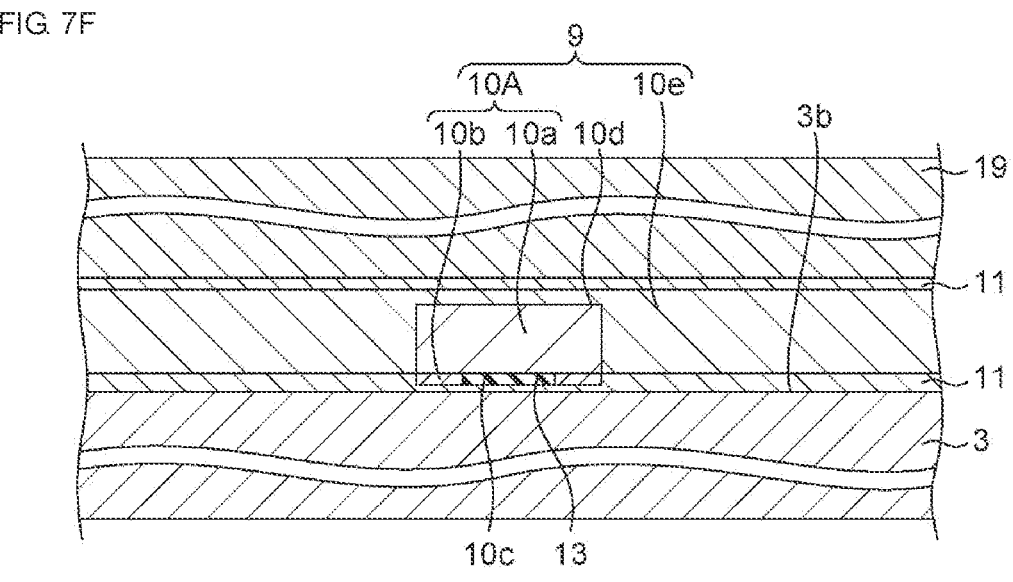
FIG. 7F is an explanatory diagram for explaining the method for manufacturing the composite component.
Figure 7G:
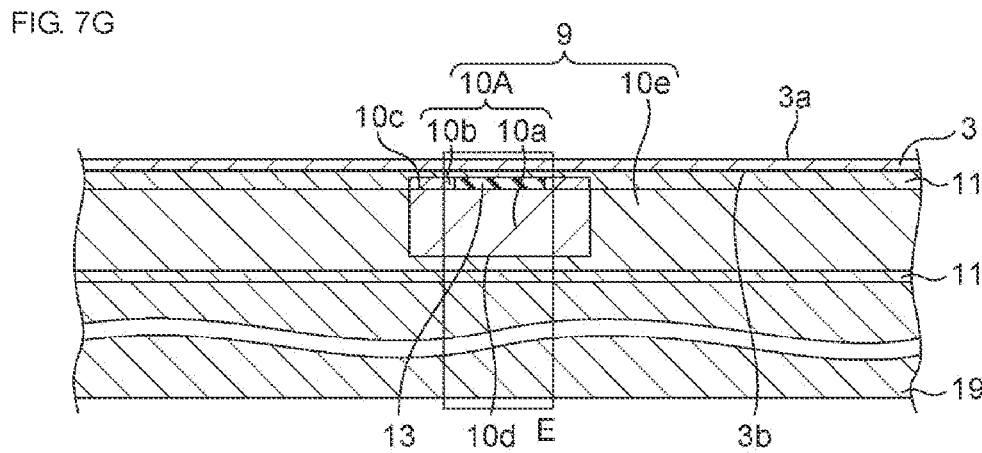
FIG. 7G is an explanatory diagram for explaining the method for manufacturing the composite component.
Figure 7H:
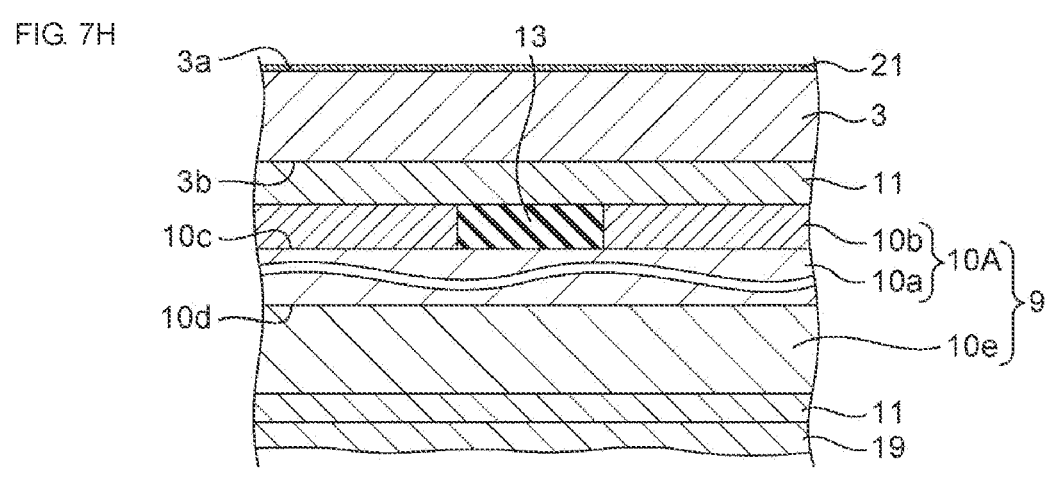
FIG. 7H is an explanatory diagram for explaining the method for manufacturing the composite component.
Figure 7K:
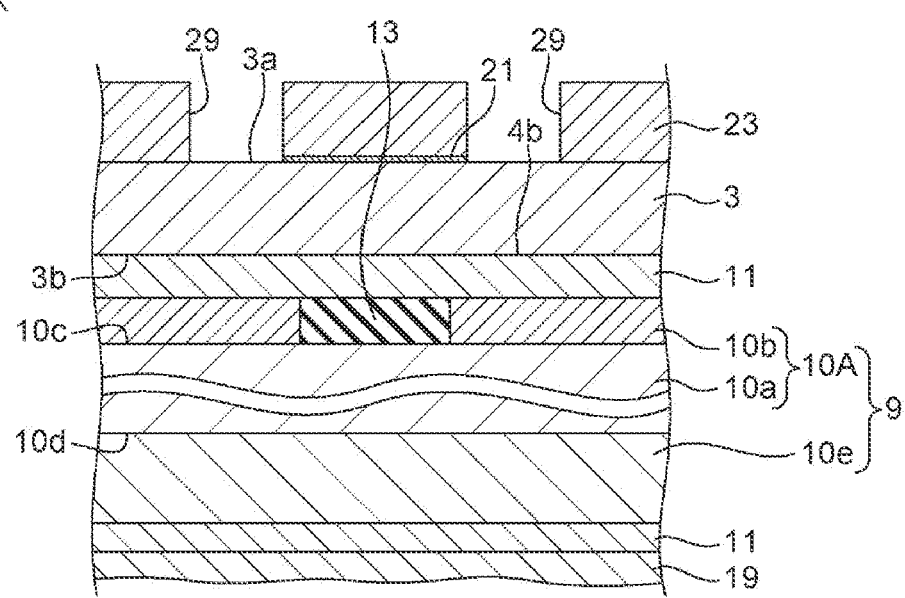
FIG. 7K is an explanatory diagram for explaining the method for manufacturing the composite component.
Figure 7L:
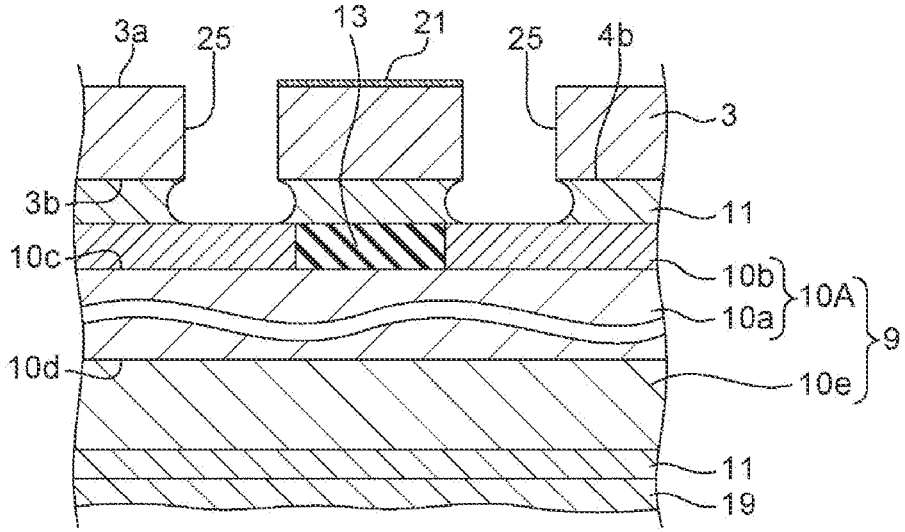
FIG. 7L is an explanatory diagram for explaining the method for manufacturing the composite component.
Figure 7I:
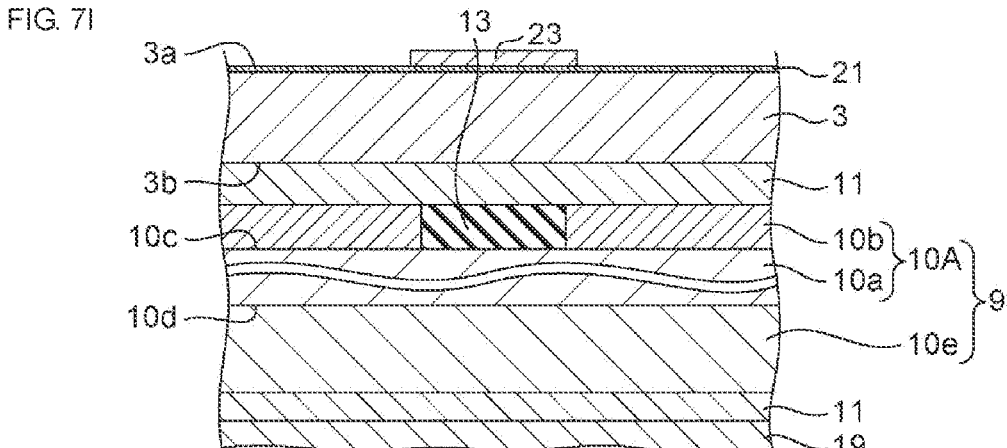
FIG. 7I is an explanatory diagram for explaining the method for manufacturing the composite component.
Figure 7J:
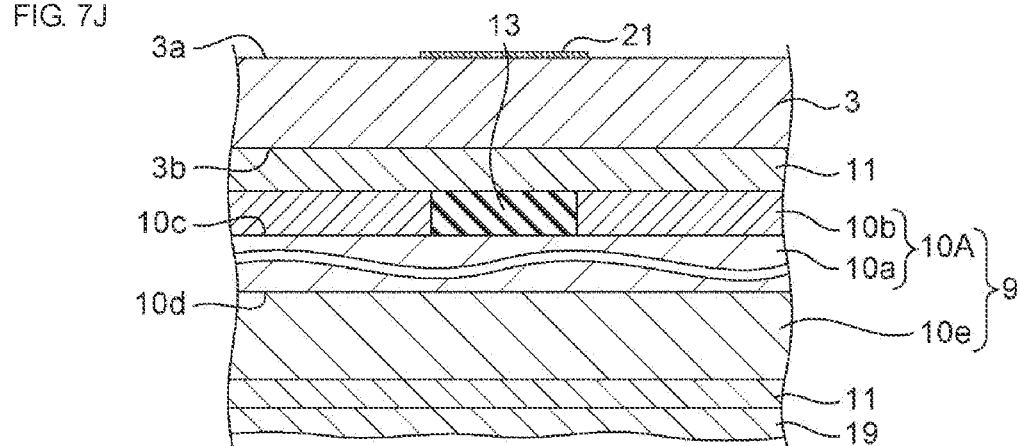
FIG. 7J is an explanatory diagram for explaining the method for manufacturing the composite component.
Figure 7M:
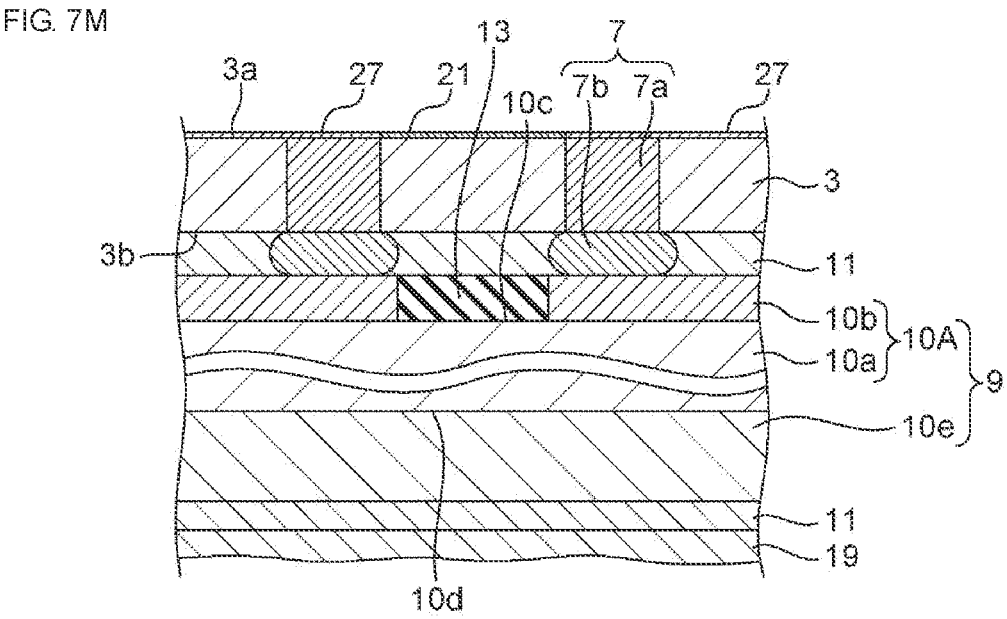
FIG. 7M is an explanatory diagram for explaining the method for manufacturing the composite component.
Figure 7N:
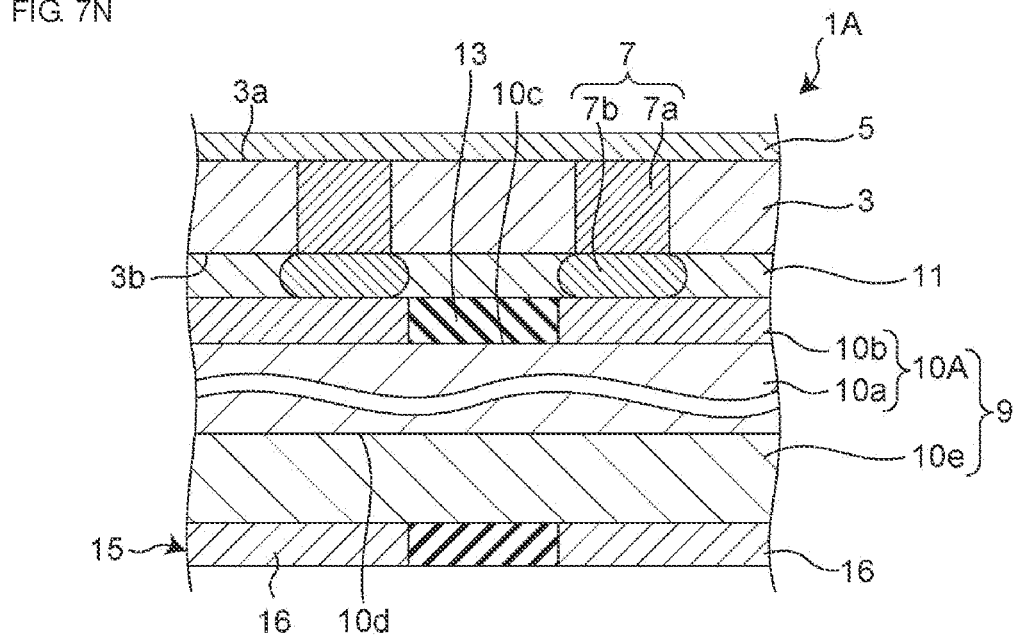
FIG. 7N is an explanatory diagram for explaining the method for manufacturing the composite component.

In the electronic component layer thinning step, as illustrated in FIG. 7E, the electronic component layer 9 is thinned. The electronic component layer 9 (to be specific, the electronic component 10A and the resin 10*e*) is ground to be thinned and flattened by using a back-grinder for a Si wafer. In the electronic component layer thinning step, as illustrated in FIG. 4E, the electronic component 10A can be ground and thinned to such an extent that a functional portion inside the electronic component 10A is not damaged. The Si support forming step to the interposer electrode forming step illustrated in FIG. 7F to FIG. 7N after the electronic component layer thinning step can be performed in the same manner as the steps illustrated in FIG. 4F to FIG. 4N, respectively. Note that FIG. 7H to FIG. 7N are enlarged as compared with FIG. 7A to FIG. 7G. FIG. 7H to FIG. 7N illustrate a part corresponding to a part E of FIG. 7G.

Note that the manufacturing conditions described above in the first and second embodiments are not limited as long as the insulating layer 13 is formed between the component electrodes 10*b* of the electronic components 10 and 10A, and the effects of the present disclosure are achieved.

The present disclosure is not limited to the first and second embodiments and can be implemented in various aspects as long as the gist of the present disclosure is not changed. In addition, the configurations described in the first and second embodiments are examples and are not particularly limited, and various modifications can be made without substantially departing from the effect of the present disclosure. For example, the matters described in the first and second embodiments can be appropriately combined. For example, the configuration described in the first embodiment and the configuration described in the second embodiment can be combined.

What is claimed is:

1. A composite component, comprising:
an interposer structure having
  a Si base layer having a first main surface and a second main surface opposite to each other,
  a redistribution layer on the first main surface,
  through-Si vias electrically connected to the redistribution layer and penetrating inside the Si base layer,
  an interposer electrode facing the second main surface,
  an adhesive layer, and
  an insulating layer; and
an electronic component having component electrodes respectively connected to the through-Si vias, the electronic component being between the interposer electrode and the Si base layer,
wherein the insulating layer is between the component electrodes of the electronic component, and in the electronic component, the component electrodes and a surface on which the insulating layer is disposed are bonded to the second main surface of the Si base layer with the adhesive layer interposed therebetween.

2. The composite component according to claim 1, wherein a level difference between an upper surface of the component electrode and an upper surface of the insulating layer in a cross section parallel to a stacking direction of the interposer structure and the electronic component is equal to or less than 1.0 μm.

3. The composite component according to claim 1, wherein surface roughness Rz of the component electrode and the insulating layer is equal or less than 1.0 μm.

4. The composite component according to claim 1, wherein a thickness of the adhesive layer is equal to or less than 10 μm.

5. The composite component according to claim 1, wherein among components constituting the redistribution layer and the insulating layer, common components occupy equal to or greater than 80% by weight.

6. The composite component according to claim 1, wherein the redistribution layer includes an inorganic material, and the insulating layer includes an organic material.

7. The composite component according to claim 1, wherein the redistribution layer includes an organic material, and the insulating layer includes an inorganic material.

8. The composite component according to claim 1, wherein in a cross section parallel to a stacking direction of the interposer structure and the electronic component, crystal grains of the component electrode increase in size from a side where the component electrode is in contact with the through-Si via toward a side opposite thereto.

9. The composite component according to claim 1, further comprising:

an electronic component layer configured with the electronic component.

10. The composite component according to claim 1, further comprising:

an electronic component layer including resin integrated with the electronic component.

11. The composite component according to claim 2, wherein surface roughness Rz of the component electrode and the insulating layer is equal or less than 1.0 μm.

12. The composite component according to claim 2, wherein a thickness of the adhesive layer is equal to or less than 10 μm.

13. The composite component according to claim 2, wherein among components constituting the redistribution layer and the insulating layer, common components occupy equal to or greater than 80% by weight.

14. The composite component according to claim 2, wherein the redistribution layer includes an inorganic material, and the insulating layer includes an organic material.

15. The composite component according to claim 2, wherein the redistribution layer includes an organic material, and the insulating layer includes an inorganic material.

16. The composite component according to claim 2, wherein in a cross section parallel to a stacking direction of the interposer structure and the electronic component, crystal grains of the component electrode increase in size from a side where the component electrode is in contact with the through-Si via toward a side opposite thereto.

17. The composite component according to claim 2, further comprising:

an electronic component layer configured with the electronic component.

* * * * *